United States Patent
Hara

(10) Patent No.: US 9,563,136 B2
(45) Date of Patent: Feb. 7, 2017

(54) YELLOW ROOM SYSTEM

(71) Applicant: National Institute of Advanced Industrial Science and Technology, Chiyoda-ku, Tokyo (JP)

(72) Inventor: Shiro Hara, Tsukuba (JP)

(73) Assignee: National Institute of Advance Industrial Science and Technology, Tokyo (JP)

( * ) Notice: Subject to any disclaimer, the term of this patent is extended or adjusted under 35 U.S.C. 154(b) by 27 days.

(21) Appl. No.: 14/363,376

(22) PCT Filed: Oct. 3, 2012

(86) PCT No.: PCT/JP2012/075681
§ 371 (c)(1),
(2) Date: Jun. 6, 2014

(87) PCT Pub. No.: WO2013/084575
PCT Pub. Date: Jun. 13, 2013

(65) Prior Publication Data
US 2014/0306124 A1 Oct. 16, 2014

(30) Foreign Application Priority Data
Dec. 6, 2011 (JP) .................................. 2011-267029

(51) Int. Cl.
*G03D 17/00* (2006.01)
*G03F 7/20* (2006.01)
(Continued)

(52) U.S. Cl.
CPC .............. *G03F 7/7075* (2013.01); *G21F 7/00* (2013.01); *H01L 21/6719* (2013.01);
(Continued)

(58) Field of Classification Search
CPC ...................................................... G03F 7/7075
(Continued)

(56) References Cited

U.S. PATENT DOCUMENTS 4,532,970 A 8/1985 Tullis et al.
4,674,939 A 6/1987 Maney et al.
(Continued)

FOREIGN PATENT DOCUMENTS

JP 2001-259473 A 9/2001
JP 2001-298068 A 10/2001
(Continued)

OTHER PUBLICATIONS

International Search Report (PCT/ISA/210) dated Nov. 13, 2012 with English translation thereof {Two (2) pages}.
(Continued)

*Primary Examiner* — Rodney Fuller
(74) *Attorney, Agent, or Firm* — Crowell & Moring LLP

(57) ABSTRACT

Arranging an application apparatus, an exposure apparatus, a developing apparatus, and similar apparatus together within a large yellow room makes it difficult to change a layout in association with a change of a recipe and to streamline a layout area and similar parameter. A yellow room system includes: a plurality of portable unit process apparatuses 50 that each have the same standardized outer shape and include a yellow room configured to shield a exposure light to a photosensitive material formed on a workpiece; conveyance containers 11 and 25 that convey the workpiece between the unit process apparatuses and itself is formed as the yellow room; and a light-shielding coupling structure that couples the unit process apparatus, which is formed on a docking port 56 disposed in the upper portion of a front chamber 80 of the unit process apparatus 50, and the conveyance containers together.

18 Claims, 9 Drawing Sheets

(51) Int. Cl.
  *H01L 21/67* (2006.01)
  *H01L 21/677* (2006.01)
  *G21F 7/00* (2006.01)
(52) U.S. Cl.
  CPC .. *H01L 21/67751* (2013.01); *H01L 21/67772* (2013.01); *H01L 21/67775* (2013.01)
(58) Field of Classification Search
  USPC .................................................. 396/589, 611
  See application file for complete search history.

(56) References Cited

U.S. PATENT DOCUMENTS

| | | | |
|---|---|---|---|
| 5,772,386 A | 6/1998 | Mages et al. | |
| 5,888,042 A * | 3/1999 | Oda | H01L 21/67769 414/222.07 |
| 2001/0041530 A1 | 11/2001 | Hara | |
| 2003/0190886 A1 | 10/2003 | Hirasawa et al. | |
| 2006/0169208 A1 * | 8/2006 | Shinozaki | G03F 7/7075 118/715 |
| 2009/0028761 A1 * | 1/2009 | Devine | H01L 21/67069 422/186.04 |
| 2009/0074402 A1 * | 3/2009 | Miyagi | H01L 21/67051 396/611 |
| 2010/0290873 A1 * | 11/2010 | Bonora | H01L 21/67766 414/267 |
| 2012/0193071 A1 * | 8/2012 | Tsunekawa | H01L 21/67109 165/61 |
| 2013/0068970 A1 * | 3/2013 | Matsushita | H01L 21/6719 250/492.2 |
| 2015/0030416 A1 * | 1/2015 | Sakiya | H01L 21/67265 414/217.1 |

FOREIGN PATENT DOCUMENTS

| | | |
|---|---|---|
| JP | 2003-302083 A | 10/2003 |
| JP | 2005-197500 A | 7/2005 |
| JP | 2008-227086 | 9/2008 |

OTHER PUBLICATIONS

Hara, Shiro, "The World of Local Cleaning," Dec. 10, 2006, pp. 176-179, First Version, Kogyo Chosakai Publishing Co., Ltd. with partial English translation thereof {Seven (7) pages}.

* cited by examiner

FIG. 13

| | MEGAFAB | MINIMAL FAB 1 | MINIMAL FAB 2 | MINIMAL FAB 3 | MINIMAL FAB 4 |
|---|---|---|---|---|---|
| FAB TYPE | | FLOW SHOP | CLASS SHOP | MULTICELL | CELL |
| FAB FLOOR SURFACE AREA | 20,000M$^2$ | 360M$^2$ | 360M$^2$ | 360M$^2$ | 30M$^2$ |
| WAFER DIAMETER | 12 INCHES | 0.5 INCHES | 0.5 INCHES | 0.5 INCHES | 0.5 INCHES |
| NUMBER OF CHIPS/WAFER (1-CM$^2$ CHIP) | 600 | 1 | 1 | 1 | 1 |
| APPARATUS WIDTH | 3M | 30CM | 30CM | 30CM | 30CM |
| NUMBER OF MASKS | 34 MASKS | MASKLESS | MASKLESS | MASKLESS | MASKLESS |
| NUMBER OF PROCESSES | 600 | 400 | 400 | 20 TO 400 | 20 TO 200 |
| NUMBER OF KINDS OF PRODUCTS HANDLED AT SAME TIME | 500 TO 2000 | 1 | 2 TO 400 | 8 TO 16 | 1 TO 2 |
| NUMBER OF WORKS IN PROCESS FOR WAFERS | 17,000 | 400 | 400 | 16 | 2 |
| NUMBER OF APPARATUSES | 300 | 400 | 400 | 400 | 22 |
| FACILITIES INVESTMENT | 300 BILLION YEN | 600 MILLION YEN | 600 MILLION YEN | 600 MILLION YEN | 50 MILLION YEN |
| APPARATUS LAYOUT | JOB SHOP | FLOW | JOB DIVIDED BY CLASS | JOB | JOB |
| WAFER UTILIZATION (PROCESS TIME/TOTAL TIME) | TO 1% | 40% | 40% | 10% | 5% |
| DAILY OPERATING TIME | 24 HOURS | 24 HOURS | 24 HOURS | 10 HOURS | 10 HOURS |
| ANNUAL CHIP PRODUCTION CAPACITY | 140 MILLION CHIPS | 0.5 MILLION CHIPS | 0.2 MILLION CHIPS | 1.5 THOUSAND CHIPS | 100 CHIPS |
| RESOURCE UTILIZATION EFFICIENCY | 0.10% | 0.20% | 0.20% | 0.20% | 0.20% |

YELLOW ROOM SYSTEM

TECHNICAL FIELD

The present invention relates to a yellow room system that shields a wavelength of light for exposing resist in manufacture of a semiconductor device or similar device.

BACKGROUND ART

In recent years, the manufacturing line for semiconductor devices includes a plurality of units called bays in which treatment apparatuses with the same type of functions are brought together within a vast clean room. A layout that employs a job-shop system has become mainstream. In the job-shop system, the bays are coupled together by a transfer robot and a belt conveyer.

As the workpiece treated in that manufacturing line, a wafer with a large diameter of, for example, 12 inches is used. In the production system, thousands of semiconductor chips are manufactured from one wafer.

However, with this job-shop system, in the case where a plurality of similar treatment processes are repeated, the conveyance within the bay or the conveyance distance between bays significantly increase in length, and the wait time increases. Thus, the manufacturing time increases. This causes a cost increase, for example, causes an increase in work in process. Therefore, the low productivity may become a problem as a manufacturing line for treating a large amount of the workpieces.

Therefore, instead of the conventional manufacturing line in the job-shop system, a manufacturing line in a flow-shop system is also proposed. In this manufacturing line, semiconductor treatment apparatuses are arranged in the order corresponding to the treatment processes.

While this manufacturing line in the flow-shop system is optimal for manufacturing singular products in large quantities, it is necessary to rearrange the location of the respective semiconductor treatment apparatuses in the manufacturing line in the order corresponding to the treatment flow of the workpiece in the case where the manufacturing procedure (recipe) needs to be changed due to a change of products. However, this rearrangement every time the products are changed is not realistic considering labor and time for the rearrangement. Especially, under the circumstances in which huge semiconductor treatment apparatuses are fixedly disposed within the closed space that is the clean room, it is realistically impossible to rearrange the semiconductor treatment apparatuses each time.

Further, in the conventional semiconductor manufacturing systems, because simultaneous productivity (production quantity per unit time) has been emphasized the most as a critical factor in order to minimize manufacturing costs, diameter scale-up in the workpiece size (silicon wafer size) and increase in the manufacturing unit count (number of orders with respect to a single product) have been given priority, pointing to gigantic manufacturing systems, megafab so to say.

In very large-scale manufacturing systems of this sort, the number of processes has exceeded several hundred, and in proportion to that, the number of bays and number of apparatuses has grown considerably.

Accordingly, although for that reason the throughput of the manufacturing lines as a whole has improved, constructing such megafab requires a facilities investment of several billion dollars, making the overall investment cost a huge sum.

Furthermore, along with such manufacturing systems going very large-scale, apparatus control grows complex and conveyance time and wait time in the conveyance system increase significantly. In response to that the number of works in process that dwell along the production line also increases significantly. Since the unit cost of the large-diameter wafers employed here is extraordinarily high, increase in the number of works in process leads to elevation in costs.

Given these and other such circumstances, productivity as a whole, including facilities investment, is said to be turning in a decreasing direction.

Therein, an approach in which the cleanroom is scaled down by means of a local cleaning production system or similar technique is beginning to gain recognition as an expeditious means in order to reduce the facilities investment having grown that huge. This local cleaning is also effective to reduce environmental control costs at the plant.

As a production example in which a local cleaning production system is applied to the entirety of the process stages at a plant, the front-end process of semiconductor integrated circuit manufacture can be given as a unique example as described in Non-Patent Literature 1. In the front-end process of this semiconductor integrated circuit manufacture, the wafers that are products are housed in containers in, and conveyed among, isolated manufacturing apparatuses. The apparatuses are each equipped with a front chamber. The front chambers have two doors. One is between the apparatus main body and the front chamber, and the other is between the front chamber and the exterior. By operating the apparatus such that one or the other of the doors is always shut, the main-body interior is shielded from the exterior at all times. The wafer containers are coupled to the front chambers. In the coupled state, this has the capacity to shield the wafer atmosphere from the exterior at a certain level of performance, enabling the exchange of wafers between the containers and the manufacturing apparatuses.

Lightness, compactness, and simplicity of the mechanisms are demanded of the containers in order to secure ease of conveyance. To fulfill these demands requires ingenuity in the way the containers open and close—in particular, in the way the container doors are housed when the doors are opened. Specifically, a method for housing the container doors within the wafer containers in being coupled with the front chambers must heed the fact that door-housing space becoming necessary will mean running counter to the demands. Given these factors means that for the doors of the wafer containers, being housed into the inside of the front chamber is an appropriate coupling structure. Hewlett-Packard Co. obtained a patent (Patent Literature 1) on a coupling method in which this point is taken into consideration.

The main features with this patent are that there are three subsystems: (1) front chambers, (2) wafer conveyance containers, and (3) there is a wafer transfer mechanism within the front chambers, and that the two doors are combined together and are moved into a clean internal space. The combination of the two doors is due to the following reasons. On the outside surfaces where the two doors contact the exterior containing fine particles, fine particles will cling to each. The combination of the doors traps these fine particles in between the two, and they are housed into the inside of the front chamber, making it possible to prevent diffusion of the fine particles into the local clean environment.

As illustrated in FIG. 1 (*a*), a container 1 is composed of a container main body 3 and a container door 4, and a front chamber 2, of a front-chamber main body 5 and a front-chamber door 6, with sealing portions provided in three locations: (a) container main body 3—container door 4, (b) front-chamber main body 5—front-chamber door 6, and (c) container main body 3—front-chamber main body 5. The key point with this patent is the sandwiching capture by the two doors for fine particles attached to the door surfaces, but that does not mean that the sandwiched fine particles are eliminated from that region. And countermeasures against the risk of fine particles scattering off the edge surfaces of the sandwiched doors and contaminating the wafers are not taken. Furthermore, since it does not amount to a structure that seals the coupling between the front chamber and with the wafer conveyance container, it lacks function of completely preventing invasion of external wafer contaminating material into the front chamber and into the wafer conveyance container.

Next, Asyst Technologies Inc. patented (Patent Literature 2) an improved mechanism for adding hermeticity to that of the Hewlett-Packard Co. patent, making it practicable for 200-mm wafer systems.

With the Asyst Technologies Inc. patent, as illustrated in FIG. 1(b), the coupled portion consists of four structures, namely, a container ("box"), a container door ("box door"), a front chamber ("port"), and a front-chamber door ("port door"), and is characterized in that among the contacts between these four structures, the four structural intervals (a) container main body 3—container door 4, (b) front-chamber main body 5—front-chamber door 6, (c) container main body 3—front-chamber main body 5, and (d) container door 4—front-chamber door 6 are sealed in order to make them hermetically tight.

Thereafter, given that the sealing system was not perfect, some patents as improvements over the Asyst Inc. patent have been registered. However, the series of improvement patents themselves have given rise to detriment such as follows, complicating the mechanisms, that is, stepped-up manufacturing costs, weight increase, creation of new fine particle generation sources, difficulties with container washing, or similar detriment. Even by means of the improvements in these patents, not only has the gas shield-off not been at a practical level, but also the fine particle shield-off has been imperfect.

Later on, in about the year 2000 the wafer size had become 300-mm, a system separate from Asyst Inc.'s above-described system was proposed, and it became a world standard for 300-mm wafer conveyance systems. This standard system is called the Front-opening Interface Mechanical Standard (FIMS) system, and while being SEMI standards (chiefly SEMI Std. E57, E47.1, E62, and E63), has been patented (Patent Literature 3). FIMS employs a container-door opening that is horizontally directed and a horizontal coupling system.

This is in contradistinction to the vertical coupling with the Asyst system. Further, with the Asyst system, given that the coupling is vertical, the wafers are housed in cassettes inside the containers. The two doors having been combined after coupling are housed inside, and then are moved together with the cassettes into the front chambers. In contrast, with FIMS, the cassettes are omitted. The two doors having been horizontally combined are moved into the front chamber. Then, after the doors subsequently have been lowered in the vertical direction, the wafers within the container are directly taken out to the front chamber using a wafer-transfer robot within the front chamber.

Furthermore, in the FIMS patent, as differing from the Asyst patent, there is no concrete structural definition regarding the sealing structure for the contact portions of the individual structural elements. In actuality, in a practical FIMS system, a structure is rendered in which clearances of about 1 to 2 mm are deliberately provided between the individual structural elements. Specifically, clearances are provided between container—front chamber, and between front chamber—front-chamber doors.

One reason for this is because if a sealing structure that relies on physical contact is provided, mechanical friction is generated in the sealing areas, and that invites large-quantity fine particle generation. But given that the clearances are provided, a drawback that occurs is that hermeticity against gas molecules is lacking in principle.

It should be noted that also in the Asyst system for 200-mm wafers, based on two reasons that are: for reducing the problem of pressure fluctuations that arise within the local environment during the opening/closing of the container doors and front-chamber doors after coupling and the problem of fine particle occurrence caused by air currents stemming due to the pressure fluctuations; and for preventing the container door from becoming difficult to open under negative pressure due to a sealed container, a pressure-relief hole that passes through the exterior is established in the container. These factors result in a structure unable to actually have the shielding performance, in particular, for gas molecules.

What may be understood from the foregoing illustrative antecedent instances is that in sealed-type mechanisms for sealing the individual areas, while it is possible to construct a local cleaning production system with an effective internal/external separation capacity with respect to small molecules such as gases, the downside is that the mechanical friction and the like in the sealing portions produces the side effect of fine particles occurring in numerous amounts. Conversely, if the structure with the clearances is employed, the fine particle generation can be reduced while it is unable to secure the capacity to separate gas molecules internally/externally. This is a shortcoming that the SMIF system has as a self-contradiction. The consequent problem has been that the practical systems cannot avoid the structures with imperfect hermeticity.

Actually, with FIMS systems introduced as the worldwide standard in all semiconductor integrated circuit manufacturing plants handling the latest 300-mm wafers, because they have the clearances, they lack the complete shielding performance not only for gas molecules, but also for particles. As a deleterious effect, although a perfect local cleaning production system originally does not need a clean room because of shielding performance, in all actual plants, the FIMS system still has been introduced within the clean rooms. That is, the current situation is that two kinds of cleaning, by a cleanroom and by local cleaning, have become necessary. This fact has increased facilities investment expenditures and requires high-level control, thus pushing up manufacturing costs significantly.

Thus, downsizing is being tried in the front-end process of semiconductor manufacturing by introducing local cleaning system.

However, this does not go beyond application to manufacturing systems up to now on extended lines, in which simultaneous productivity (production quantity per unit time) has been emphasized the most as a critical factor in order to minimize manufacturing costs. That is, as is typified by the above-described FIMS, diameter scale-up in the workpiece size (silicon wafer size) and increase in the manufacturing unit count (number of orders with respect to a single product) have been given priority, thus still pointing to giant-scaled manufacturing systems, megafab so to say.

FIG. 13 illustrates the effect of size on the semiconductor manufacturing system based on this megafab.

For a cutting-edge semiconductor plant (megafab) in which where the wafer size is 12 inches in the current status, an apparatus count is 300 machines, the number of work in process for wafers that stays in the system is 17,000, the number of masks to be used is 34, and a floor surface area is 20,000 square meters, and the facilities investment total comes to approximately three billion dollars. In this case, the monthly production capacity provides 140 million items per year expressed in terms of 1-cm chips. However, the wafer utilization is less than 1% and the resource usage efficiency is less than 0.1%. Here, as preconditions, assume that the time required by each process (cycle time) is 1 minute/wafer, the process count for semiconductor with eight metallic layers is 500 processes, and the design rule is 90 nm.

Meanwhile, there is the need for manufacturing semiconductor in very small quantities, for example, several pieces to several hundreds of pieces in a manufacturing unit for engineer samples or ubiquitous sensors.

Except this very large-scale manufacturing system, this ultra-small production can be carried out without having to sacrifice cost performance that much. However in a very large-scale manufacturing system, the flow-shop system extremely reduces the cost performance for manufacturing semiconductor in very small quantities in the manufacturing line. Therefore, other kinds of products need to be manufactured in that manufacturing line at the same time.

However, when a wide variety of products are input at the same time for mixed production in that manner, the productivity of the manufacturing line further decreases with increasing number of types of products. As a result, in this very large-scale manufacturing system, very small-quantity production and multiproduct production cannot be appropriately managed.

Conventionally, in a device manufacturing system that employs a flow-shop system or a job-shop system, various measures against drop in utilization in with each system have been proposed (Patent Literature 4 or Patent Literature 5).

CITATION LIST

Patent Literature

PATENT LITERATURE 1: U.S. Pat. No. 4,532,970
PATENT LITERATURE 2: U.S. Pat. No. 4,674,939
PATENT LITERATURE 3: U.S. Pat. No. 5,772,386
PATENT LITERATURE 4: Japanese Unexamined Patent Application Publication No. 2005-197500
PATENT LITERATURE 5: Japanese Unexamined Patent Application Publication No. 2008-227086

Non-Patent Literature

NON-PATENT LITERATURE 1: "The World of Local Cleaning" (Shiro Hara, Kogyo Chosakai Publishing Co., Ltd. ISBN 4-7693-1260-1 (2006))

SUMMARY OF INVENTION

Technical Problem

The inventions discussed in Patent Literature 4 and Patent Literature 5 are designed for streamlining in the flow-shop system and the job-shop system. However, with either very small-quantity production of multi-product types or large-volume production of single product types, they are not sufficient to improve the cost performance while ensuring product quality. That is, they are not sufficient to flexibly manage type-changing/volume-changing production.

Further, in conventional very large-scale semiconductor manufacturing systems, the individual manufacturing apparatuses are gigantic, and thus cannot be easily moved once these are set within the plant. Consequently, it is difficult to move these apparatuses, and it is almost impossible to change the arrangement so as to shorten the conveyance paths for the products. Additionally, maintenance and repairs must be performed on-site because the apparatuses cannot be sent back to their manufacturing plant. Thus, there is the need for large-expenditure labor costs for workers sent out and for a lot of time as difficulties. The enormity of the apparatuses has been a significant factor in huge apparatus price and huge product manufacturing cost.

In addition, in the front-end process of semiconductor manufacturing systems as described above, a yellow room system that shields the photosensitive resist formed onto the semiconductor wafer from the exposing light (UV light) are constructed. At this time, shielding from the exposing light is usually necessary in three processes from resist application to exposure to developing. Therefore, arranging the three stages together within the yellow room proves efficient.

However, while putting these three stages into the yellow room seems to be efficient, it brings about the limitation of always having to dispose all the apparatuses for the three stages together. Specifically, this limitation does not allow an apparatus layout in the flow-shop system in which arranging apparatuses in the manufacturing-recipe order can minimize the conveyance distances, thus ensuring high-speed conveyance and minimizing the contamination opportunities. The processes from the application to the exposure to the developing are continuous processes. However, if the preceding cleaning and film deposition, the etching and the resist removal process after those three processes, and similar process cannot be included in the yellow room, the yellow room must be provided for each of these three processes. These three processes are repeated 30 to 40 times. Thus, 30 to 40 yellow rooms are required. This means that extraordinarily inefficient manufacturing facilities are necessary. In order to avoid this, the three processes alone are put together into one location as one yellow room. The result is that an efficient flow shop cannot be realized.

A drawback of a yellow room in which the three processes are put together is that it necessitates the cost of building and preparing a room that blocks the exposure light. Since the room is isolated, the conveyance distances within the plant become longer. Moreover, for the workers, it is not a comfortable work environment. The current manufacturing apparatuses for microfabrication in practical use are premised on arrangement within a yellow room, thus having structure without any consideration for shielding light.

The present invention has been made in view of the above-described actual situation, and its object is to provide, similarly to the above-described local cleaning production system, a local yellow-room production system that can flexibly manage type-changing/volume-changing production in the front-end process for manufacturing devices such as semiconductors.

A further object is to provide a local yellow-room production system that can significantly reduce the apparatus price, the product manufacturing cost, or the maintenance cost.

In particular, an object is to provide a local yellow-room production system as a coupling system that needs not to collect the apparatuses regarding the three processes together in one location, can completely shield the conveyance of workpieces between these three processes from the light for exposing the photosensitive resist on the workpiece, can shield gas molecules with a physical space separation structure, and can further eliminate the generation of fine particles.

Solution to Problem

In order to solve the above-described problem, the present invention is a yellow room system that includes a plurality of portable unit process apparatuses, a conveyance container, and a light-shielding coupling structure. The plurality of portable unit process apparatuses has a same standardized outer shape. The unit process apparatus includes a yellow room configured to shield a exposure light to a photosensitive material formed on a workpiece. The conveyance container is configured to convey the workpiece between the unit process apparatuses. The conveyance container is formed as the yellow room. The light-shielding coupling structure couples the unit process apparatus and the conveyance container together.

Furthermore, in the yellow room system, the conveyance container includes a conveyance-container main body, a conveyance-container door, and a first sealing structure. The conveyance-container main body forms a housing space for the workpiece. The conveyance-container door is configured to shield the housing space. The first sealing structure is configured to seal the housing space by tight coupling between the conveyance-container main body and the conveyance-container door. Each of the conveyance-container main body, the conveyance-container door, and the first sealing structure is formed of a member configured to shield a exposure light to the photosensitive material formed on the workpiece.

The unit process apparatuses each include: a front chamber to be coupled to the conveyance container; and a treatment chamber to be coupled to the front chamber.

The front chamber includes a front-chamber main body, an opening portion, a front-chamber door, and a second sealing structure. The front-chamber main body is formed of a member configured to shield the exposure light. The opening portion is disposed at the front-chamber main body. The opening portion is opened to the treatment chamber. The front-chamber door is configured to shield the front-chamber main body from the exposure light. The second sealing structure is configured to seal the front chamber by tight coupling between the front-chamber door and the front-chamber main body and configured to shield the exposure light.

The conveyance container and the front chamber have a third sealing structure configured to: ensure sealing by tight coupling between the conveyance container and the front chamber; and shield the exposure light. The conveyance container and the front chamber have a structure configured to form one indivisible coupling chamber sealed by the third sealing structure only while the conveyance container and the front chamber are tightly coupled together so as to separate the conveyance-container door from the conveyance container.

Furthermore, the following configuration is possible. A work area and a conveyance area for the workpiece are configured to shield the exposure light. The work area includes at least a treatment position of the workpiece within the treatment chamber. The conveyance area is disposed from the work area to a door opening position of the conveyance-container door.

Also, the following configuration is possible. A structure is further provided and configured to open the conveyance-container door by attracting the conveyance-container door to the front-chamber door using a magnetic force of a magnet of the front-chamber door.

Also, the following configuration is possible. A clearance is disposed between an magnetized object of the conveyance-container door and a magnetic material of the conveyance-container main body and a clearance is disposed between the magnetic material of the conveyance-container door and the magnet of the front-chamber door, so as to open and close the conveyance-container door.

Also, the following configuration is possible. The unit process apparatus is a sealed-type treatment apparatus configured to perform a singular treatment process in a device manufacturing process. The unit process apparatus is portable. The conveyance container is a sealed-type conveyance container configured to house one wafer as a workpiece target. The wafer housed in the sealed conveyance container has a wafer size for manufacturing a device in a minimized unit.

Also, the following configuration is possible. The minimized unit is one. The wafer size is 0.5 inches in diameter.

Furthermore, the following configuration is possible. The unit process apparatus is constituted as an application apparatus for a photosensitive material on a workpiece. The application apparatus includes a sealed-type container main body, a supplying member, and a plug-in connector. The container main body houses the photosensitive material and is configured to shield the exposure light. The supplying member is configured to supply the photosensitive material onto a workpiece. The plug-in connector removably couples the container main body and the supplying member together. The plug-in connector has a structure configured to shield the exposure light. The plug-in connector includes a valve configured to open during coupling.

Herein, "unit process apparatus" means an apparatus for treating a process unit that can be housed within the capacity of a single container with conveyability, for example, one among processes such as application, exposure, developing, and ion implantation. In addition to indicating a single treating process among conventional device-treating processes, the treating process includes a plurality of conventional treating processes as long as they can be housed within the capacity of the container (for example, together with the aforementioned, an water cleaning or a drying treatment, included in the same processing apparatus), or otherwise includes what is conventionally carried out as a single treating process divided into a plurality.

Also, "including a yellow room" means either that the unit process apparatus itself is formed as a yellow room configured to shield out the exposure light, or else that a treatment space that shields out the exposure light is provided within the unit process apparatus.

Further, "front chamber" means a space coupled with the treatment chamber where the workpiece is treated. However, in situations where spatial partition from the treatment chamber is not necessary, the front chamber may be the treatment chamber itself.

Advantageous Effects of Invention

The present invention allows providing a yellow room system that can flexibly handle type-changing/volume-changing production and that can greatly reduce apparatus prices and the product manufacturing costs, as well as maintenance costs. Also, since workers need not be present within the yellow room, the workplace environment can be improved.

More specifically, the respective atmospheric pressures of the container interior, the space constituted by the three seals, and the front chamber interior can be put at the same level. This allows providing a yellow room system that does not require the container interior at the same atmospheric pressure as the external air and that can prevent debris, dust, particles, and similar material from invading the front chamber interior during opening/closing. Moreover, detaching/attaching of the container door and front-chamber door is carried out by magnetic force. Therefore, the following yellow room system can be provided. There are no sliding parts in detaching/attaching, and there is no generating of fine particles. In cases where a magnetically closed circuit is formed, the magnetism does not leak to the exterior and also the photosensitive resist on the workpiece can be reliably shielded from the exposure light.

BRIEF DESCRIPTION OF THE DRAWINGS

FIG. 13 is a table for describing the effect of the size of semiconductor systems.

DESCRIPTION OF EMBODIMENTS

Figure 1:
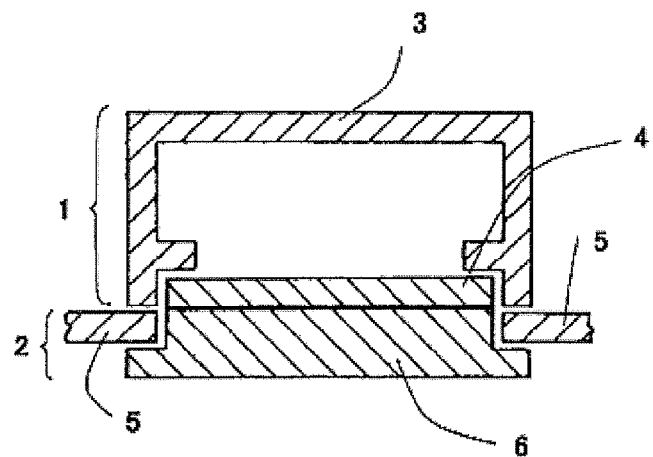
FIGS. 1(a) and 1(b) are schematic diagrams of conventional coupling between a conveyance container and a front chamber of an apparatus.
FIG. 1(c) is a schematic diagram of a coupling system between a conveyance container and an apparatus according to the present invention.
Figure 1:
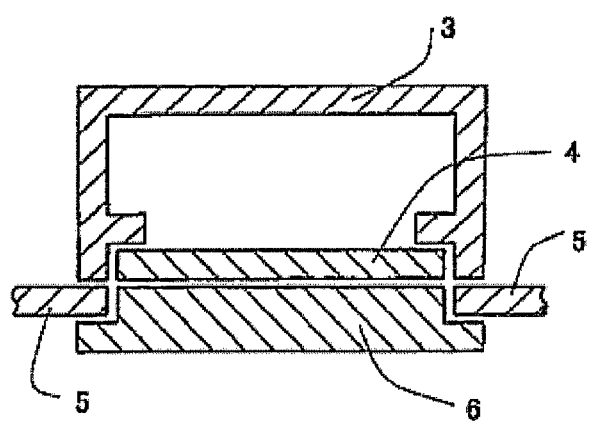
Figure 1:
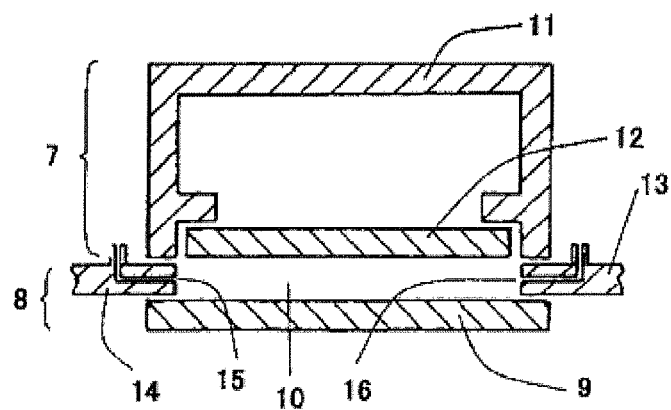

With the present invention, a conveyance container and a unit process apparatus are each constituted as a yellow room system that shields a photosensitive material formed on a workpiece, for example, a photosensitive resist formed on a wafer from an exposure light.

Furthermore, the conveyance container and a front chamber in the unit process apparatus are air-tightly coupled together, only two doors required for moving the content between them are provided. One is a door to the container, and the other is a door to the front-chamber main body. These two doors have shapes that form a coupling chamber only while the conveyance container and the front chamber are air-tightly coupled together. Given that the inner sides of the coupling chamber are originally the outer sides of the two doors, they are surfaces for which there is a possibility of contamination by being exposed to exterior space. Accordingly, in the case where the coupling chamber is formed and the inside of the coupling chamber is equipped with a cleaning mechanism, this configuration can ensure more cleanliness and realize the separation between the internal space and the outside. The internal space is formed by the inner portion of the conveyance container, the inner portion of the front chamber, and the coupling chamber.

With the present invention, because a spatially anchored front chamber is not required, a door furnished in between the front chamber and the treatment chamber need not necessarily be provided. Corresponding to this door, not only the required number of doors is reduced by one, but also resolve the imperfect internal/external shielding performance of the conventional local cleaning production system is resolved. In the present invention, when the front chamber and the conveyance container are coupled, a coupling chamber hermetically shield from the outside is formed. For that purpose, the following three sealing structures are furnished.

To begin with, the conveyance container is constituted from a member that shields the photosensitive resist or other photosensitive material formed onto the workpiece made internally present from the exposure light. It may be constituted such that a shielding film that shields the exposure light is formed on the surface of the conveyance container.

Then, by means of tight coupling between the conveyance-container main body and the conveyance container door, they have a hermetically sealable first sealing structure (Seal 1). As a mechanism employed for the tight coupling, a publicly known means such as a latch can be adopted.

Next, the front chamber is configured to shield the photosensitive resist from the exposure light. Then, by means of a tight coupling between the front-chamber main body and the front-chamber door, they have a hermetically sealable second sealing structure (Seal 2). Finally, the conveyance-container main body and the front-chamber main body, by means of a tight coupling between the two, have a hermetically sealable third sealing structure (Seal 3). During coupling of the conveyance container and the front chamber, since the third seal is established in addition to the first two seals, one indivisible hermetically sealed coupling chamber is formed.

These first through third sealing structures (that is, Seal 1 through Seal 3) are each constituted by a member that shields the exposure light.

Therein, adopting a publicly known sealing means such as O-rings or gaskets for these sealing structures is possible.

In order that the coupling chamber that is created during coupling constitutes a hermetically-sealed chamber, environments such as the pressure, fine particle-concentration, and gas-concentration in the coupling chamber are controllable. In order to control the environments, the coupling chamber is equipped with an input port and an output port, with the objective of in/outputting gas or pressure control. In this structure, combining the container door and the front-chamber door to trap and store fine particles is not necessary.

With this structure, since a function of mutually shielding the exterior and manufacturing-article space completely with respect to both fine particles and gas molecules is obtained, the structure is referred to as a cleaning airtight coupling (Particle Lock Air-tight Docking, abbreviated PLAD) structure.

The walls forming the coupling chamber that is formed when the front chamber and the conveyance container are combined are constituted by respective single sections of the conveyance-container main body, the conveyance container door, the front-chamber main body, and the apparatus door. In a state in which the front chamber and conveyance container are not combined, the surface of the sections that become the chamber's internal walls are in contact with external space. Thus, contaminant substances and gas molecules in the external space are attached and contaminate the surfaces.

These surfaces that are exposed to the external space are still contaminated even after forming the interior walls of the coupling chamber. This contamination adhering to the walls can be discharged through an exhausting port such that a clean gas is ejected through a clean-gas injection port provided in the coupling chamber to strip away fine particles adhering to the coupling chamber interior walls from the surfaces by the blowing force of the gas.

By the introduction of clean gas, gas molecules chemically adsorbed to the surfaces can be stripped away from the surfaces by replaced with the clean gas.

What is crucial is that hard-stuck substances and molecules remaining on the surfaces with a strong bonding force, which cannot be eliminated by the introduction of a clean gas, can be ignored, since they will not separate off the surfaces even after the conveyance container door and the front-chamber door have been opened, because the conveyance container and the apparatus become unitary.

Furthermore, the fine particles and gas molecules generated due to friction or similar reason by physical contact between the conveyance container and the front chamber during combining can also be eliminated from the coupling chamber by the introduction of a clean gas before the two doors are opened. Thus, contamination inside the coupling chamber that arises due to the formation of Seal 3 is eliminable by the present method.

Also, if the atmosphere inside the coupling chamber is controlled into an atmosphere that is identical with the atmosphere of the front chamber interior, the composition of the atmosphere inside the front chamber will not vary before and after the conveyance container door and the front-chamber door are opened.

After the coupling chamber has been cleaned by the clean gas, Seal 1 and Seal 2 are released. That is, by opening the conveyance container door and the front-chamber door being directed at the apparatus interior, the spaces within the conveyance container and the front chamber become unitary. This enables conveyance of objects between the two. At this time, when Seal 1 and Seal 2 are physically pulled apart, there is a possibility that some fine particles and gas molecules might issue from the locations where these seals and the two doors each face against the members of the conveyance container and the front chamber.

If these contaminants that have been generated invade the conveyance container interior and the front chamber interior, they become a source of contamination of the conveyed objects. Consequently, an expedient to move the contaminants that have been generated at the seals toward the coupling chamber is necessary. Movement of the contaminating substances into the coupling chamber is made possible by setting the atmospheric pressure of the coupling chamber lower than atmospheric pressure of both the inside of the conveyance container and the inside of the front chamber. This is because matter flows in the direction of lower atmospheric pressure. Contaminant substances attracted to the coupling chamber are discharged through the exhaust hole to the outside. Thus eliminating contaminant substances generated at the coupling sections is possible as long as the inside of the container is airtight and the coupling chamber is provided.

In cases where the atmospheric pressure of the coupling chamber is at a pressure differential of a certain extent with respect to the atmospheric atmospheric of the conveyance container interior and the front chamber interior, however, there is a possibility that working against this pressure differential to open the conveyance container door and the front-chamber door may prove difficult.

As is clear from the foregoing structures and operations, the coupling chamber that is temporarily formed can be vacuum-exhausted. Accordingly, even in situations where the front-chamber main body and the conveyance container interior are at vacuum pressure, drawing a vacuum on the coupling chamber makes it possible to open the door in a state where there is essentially no pressure differential between the two sides of the door.

In general, in vacuum devices, it is often the case that the vacuum-device body is always maintained at a vacuum in order to avoid the time for returning the vacuum in the vacuum-device body to air and to avoid contamination produced on that account. For that purpose, ordinarily a chamber is provided in the vacuum device. The chamber goes back and forth between air and a vacuum. For that reason the chamber is sometimes called an air-lock chamber. With the present invention, inasmuch as the coupling chamber plays the role of the air-lock, that is, because it goes back and forth between air and a vacuum, a fixed chamber of the conventional type is unnecessary. Ordinarily, since the chamber itself possesses a door and a conveyance mechanism, the volumetric capacity of the chamber is relatively large. Thus, a fair amount of time is required also to exhaust the chamber. On the other hand, with the present invention, the rather small space made when the container and the front chamber are combined is enough for the coupling chamber. Accordingly, purification of the coupling chamber itself during coupling does not take that much time, and it is enough that the device required therefor be small-scale.

In situations where contamination of the product due to fine particles becomes a problem, especially, an operation to purify the coupling chamber is necessary. On the other hand, in situations where fine particle contamination is not a problem, but gas-molecule contamination is a problem, if the influence of the contamination is not relatively serious, it is possible to omit the gas-introduction and gas-exhaust ports from the coupling chamber. The volumetric capacity of the coupling chamber is extremely small compared with conventional front chambers. Therefore, the absolute quantity of the contaminating substances in the interior is slight. Then, the contaminating substances are diluted by dispersing inside the volume of the conveyance container and the manufacturing apparatus. The concentration of the contaminating substances drops by, for example, four digits or more. In applications in which, with a diluted contaminant concentration, there are no problems, drawing a vacuum on the coupling chamber in order to purify it, installing a port in order to introduce clean gas, or the like are not necessary.

Next, a method of opening/closing the conveyance container will be described.

The conveyance container door has a structure whereby it opens onto the front chamber interior after it is combined with the front chamber. With a method, supposing, whereby the container door is opened outward of the container prior to it being combined, one more door would be necessary, so that the container interior not be exposed to the exterior. Therefore, this would be disadvantageous in terms of economy of space and efficiency of the mechanisms. With a method whereby the conveyance container door is housed into the interior of the container, drawing it in depth-ward increases the volumetric capacity by the amount used by the movement of the conveyance container door. Therefore, the conveyance container scales up, which is not desirable. Accordingly, the door of the conveyance container is housed into the front chamber interior.

For the structure for housing the door inside the conveyance container, it is possible to adopt the system employed in residential doors, in which hinges are put on the door to open and close it. But since large quantities of fine particles are generated from a sliding portion of the hinges, this also is not a suitable method. In the present invention, the conveyance container door is separately housed into the front-chamber main body. Seal 1, hermetically sealing the conveyance container door and the conveyance-container main body, is positioned in between the conveyance container door and the conveyance-container main body. When the conveyance container door moves perpendicularly to be housed into the front-chamber main body, there is no lateral slipping against the seal, and therefore friction between the door and the body is held to a minimum.

The container door opens/closes by means of a door-hook mechanism or the like provided with the front-chamber door. In the present invention, as a mechanism to reduce the generation of fine particles and gas molecules, a magnetic hook mechanism is utilized. With generally used mechanical key mechanisms, in which the sliding parts are numerous, large quantities of fine particles are generated by the sliding movements that arise during opening/closing. Consequently, they should not be used in cases where high-level purification is demanded. The opening/closing mechanism using magnetism does not involve mechanical operations and does not cause sliding movements. Therefore, the quantity of fine particles generated is markedly slight. Thus, this mechanism suits high-level purification.

With the present invention, magnetic materials (at least one of which is a magnet) are provided on the conveyance-container main body and the conveyance container door. The conveyance-container main body and the conveyance container door are closed by the attractive force between the magnetic materials. With a magnet incorporated into the front-chamber door, the conveyance container door is attracted to the front-chamber door by the magnetic force. Thus, the conveyance container door is opened. In that case, in order to adjust the magnetic force that operates, depending on the situation, it may be necessary not to bring the electromagnets, magnetic materials, or similar member into close contact with one another.

Although a magnetic opening/closing mechanism as in the present invention is superior to a mechanical opening/closing mechanism in terms of purification, the magnetic opening/closing mechanism is inadequate in some respects as an actual opening/closing mechanism for the conveyance container. One of the reasons is that magnetic force is strongly dependent on the interval between the magnetic materials, the attractive force rapidly grows strong at the interval of 1 mm or less, and conversely, the attractive force rapidly grows weak at the greater interval. Thus, advanced precision is demanded of the product structures. Especially in situations where the magnetic materials have come into contact, seen from a micro-scale, the magnetic-material surfaces are rough. If the precision does not reach the micron level, the force of magnetic attraction will not be what is intended. And in situations where there are a large number of the same items like the conveyance containers, since the individual containers will have slightly different dimensions, there is a likelihood that the magnetic attractive force will differ among the individual containers.

In order to avoid the foregoing problems, in the present invention, a structure may be adopted whereby the distances between the magnetic materials are controllable. Since the change in attractive force at the micro-scale distances at which the two magnetic materials contact is abrupt, the objective is to avoid such approaching distances so as not to use them in practice. Having the design be to keep the distance apart at the level of several tens of microns ensures a comparatively reduced difference in attractive force at a 10 μm precision tolerance. In addition, in order to compensate this reduced difference in attractive force, the magnetic force of the release mechanism on the apparatus side is determined using a magnetic force that provides the weakest attractive force as reference.

[Conveyance Container]

A conveyance container in the present invention is a hermetic container for conveying objects (workpieces) that produce some hindrance such as contamination or reactions by being exposed directly to the external air, and is configured so as to shield photosensitive material formed on the objects from an exposure light. The "objects" widely employ objects to be handled at present within apparatuses such as clean rooms and glove boxes that are used in a variety of applications such as semiconductor substrates and sensor substrates.

In accordance with the characteristics of the properties of the objects to be conveyed, the materials and characteristics of the conveyance-container main body and door can be selected. For example, materials excellent in moisture resistance and dimensional stability, such as poly(meth)acrylate, polycarbonate, polyethylene terephthalate, quartz, and glass are preferably employed. In order to open/close the conveyance container door under magnetic force as described above, a magnetic material and a magnet are disposed in locations tightly sealed with the door on the conveyance-container main body formed by at least these materials.

And in order that the conveyance container have light-blocking properties, these materials are selected as materials that shield the exposure light, or a shielding layer that shields the exposure light is provided on the surface of the materials.

Of course, the size of the conveyance containers is decided in connection with the size of what is conveyed. Further, it is possible to provide a plurality of chambers in one conveyance container in order to house a plurality of objects. For example, it is possible to provide one door on each of the front and rear surfaces of one conveyance container, and provide an isolated chamber in the interior thereof. Alternatively, it is possible to provide a plurality of doors adjacent to one another on the surface of a discoid conveyance container, and provide respective chambers corresponding to doors.

When conveyance container is used solitarily as a container, for example, in the midst of conveyance of the conveyance container, it is preferred to provide a mechanism for locking the door so that the door does not open accidentally or to provide a mechanism for automatically releasing the lock when the conveyance container and the front chamber are air-tightly coupled together from a usability aspect.

Accidental movement of the object housed within the conveyance container makes it difficult to open the door of the conveyance container so as to introduce the object into the front chamber interior or increases the possibility of damage of the housed object itself. Therefore, it is necessary to provide some sort of means such as a pressing member for anchoring the housed object.

[Interface Between Conveyance Container and Front Chamber]

The surface on the door side of the conveyance container coupled to the front-chamber door. Here, it is necessary to position the door of the conveyance container with respect to the front-chamber door with high-level precision and without displacement. In this respect, this is the same in instances where the conveyance container is coupled manually to the front-chamber door or instances where it is coupled in the conveyance apparatus.

If there are areas where there is sliding friction between the conveyance container and the front-chamber door, those areas will cause particles and then may contaminate the front chamber interior or contaminate the objects in the conveyance container interior. For this reason it is necessary to provide a specialized structure on the door side of the conveyance container.

Firstly, the conveyance container door is installed in a way to be embedded into the conveyance-container main body. Then on the peripheral edge portion of the surface on the door side of the conveyance-container main body, an inclined portion over the lateral surface of the conveyance container is provided. This inclined portion is disposed to engage an inclined portion that is provided on the peripheral edge portion of a port in the front-chamber main body and provided directed toward the center portion of the port.

In addition, in a portion of the conveyance-container main body around the door of the conveyance container, a plurality of protrusion portions is provided, and the protrusion portions are fit to depressed portions provided in the port of the front-chamber main body.

Furthermore, three distal ends are provided as hemispherical projections on the exterior surface of the conveyance container door. Corresponding to the protrusions, three V-shaped grooves are provided radially in the front-chamber door surface.

Utilizing the conveyance-container main body, the conveyance container door, the front-chamber main body, and the front-chamber door in this structure, the conveyance container is coupled to the front-chamber door in the following manner at a high level of precision.

At first, the conveyance container having been drawn close to the front-chamber main body begins to be inserted to fit the above-described inclined portion provided on the peripheral edge portion of the surface on the door side of the conveyance-container main body with the inclined portion provided on the peripheral edge portion of the port in the front-chamber main body. In the middle of the insertion, the conveyance container is positioned with the front-chamber main body to an extent where there is a certain amount of looseness.

Subsequently, the plurality of protrusion portions provided on the portion of the conveyance-container main body around the conveyance container door are fitted into the depressed portions provided in the front-chamber main body port. At that point, the aforementioned certain amount of looseness is fairly curtailed so as to control rotation of the conveyance container with respect to its perpendicular axis to a certain extent.

In that state, when the conveyance-container main body draws nearer to the front-chamber door, the three protrusions with the hemispherical distal ends provided in the door of the conveyance container enter into the aforementioned three V-shaped grooves provided in the door of the front-chamber main body. At that time, the two opposing diagonal surfaces that constitute one of the V-shaped grooves each come into contact with the hemispherical protrusion. The hemispherical protrusion comes into contact with the two opposing diagonal surfaces in two locations.

As a result, jerking of the conveyance container in the rotation direction with respect to the perpendicular axis disappears, and also jerking in the horizontal direction is eliminated by the three V-shaped radially patterned grooves.

This mechanism does not allow the conveyance container to move other than along the vertical with respect to the apparatus and anchors the conveyance container.

The following describes an exemplary embodiment of the present invention by referring to the accompanying drawings. With the present invention, a conveyance container and a unit process apparatus are each constituted to shield a photosensitive material formed on an object (workpiece), for example, a photosensitive resist formed on a wafer from an exposure light.

Figure 10:
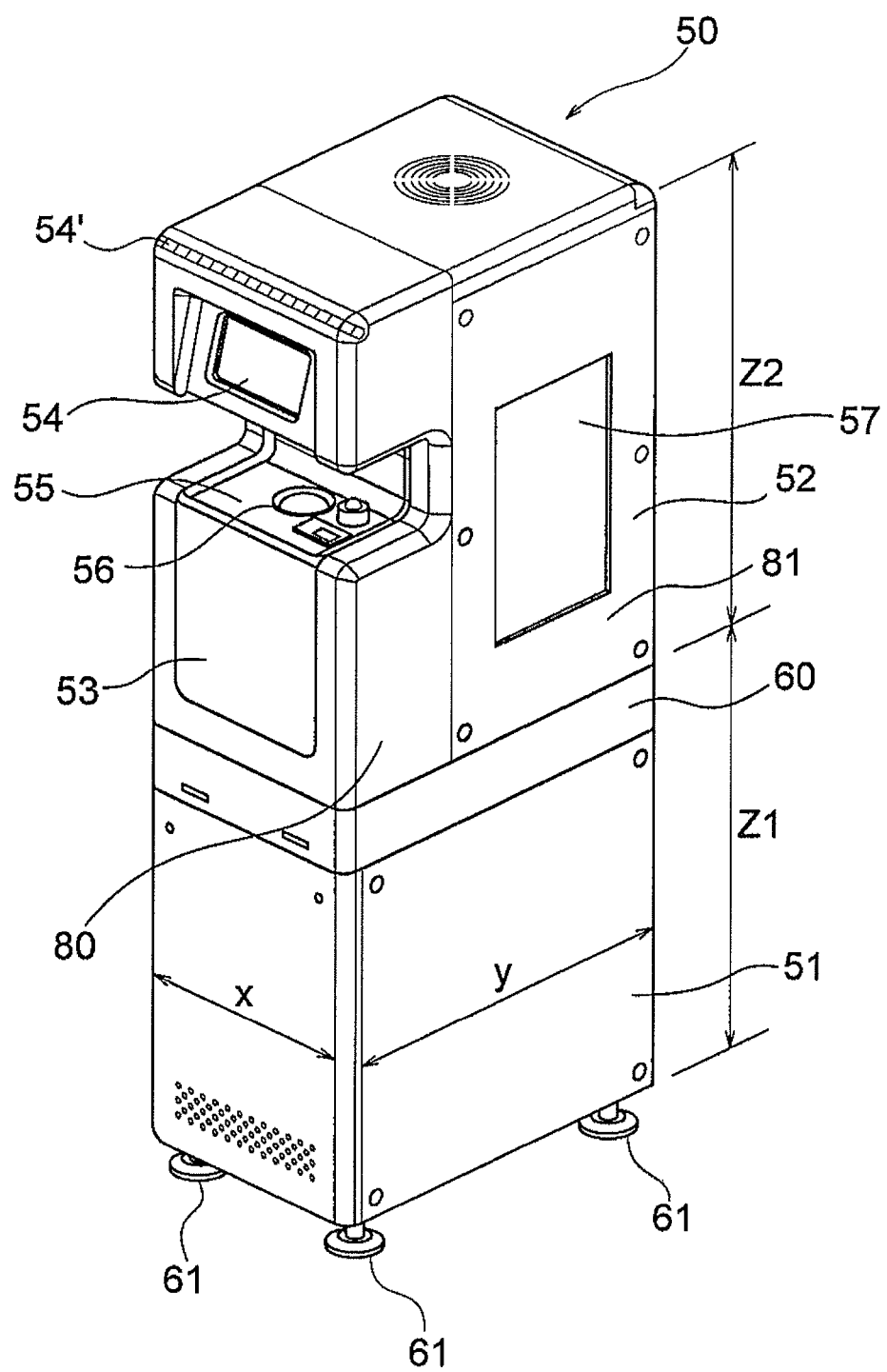
FIG. 10 is a perspective view of a unit process apparatus according to the present invention.
Figure 11:
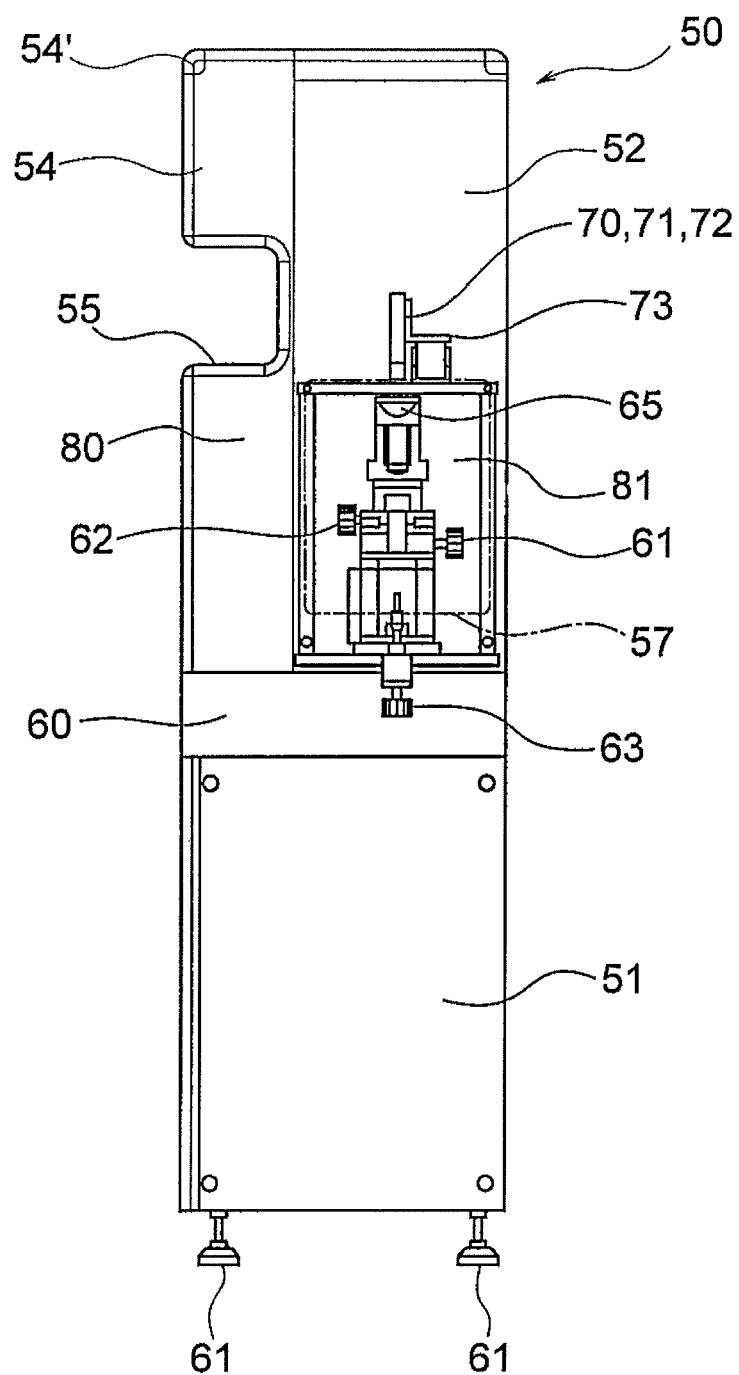
FIG. 11 is a cross-sectional view of a part of the exposure apparatus as the unit process apparatus according to the present invention.
Figure 12:
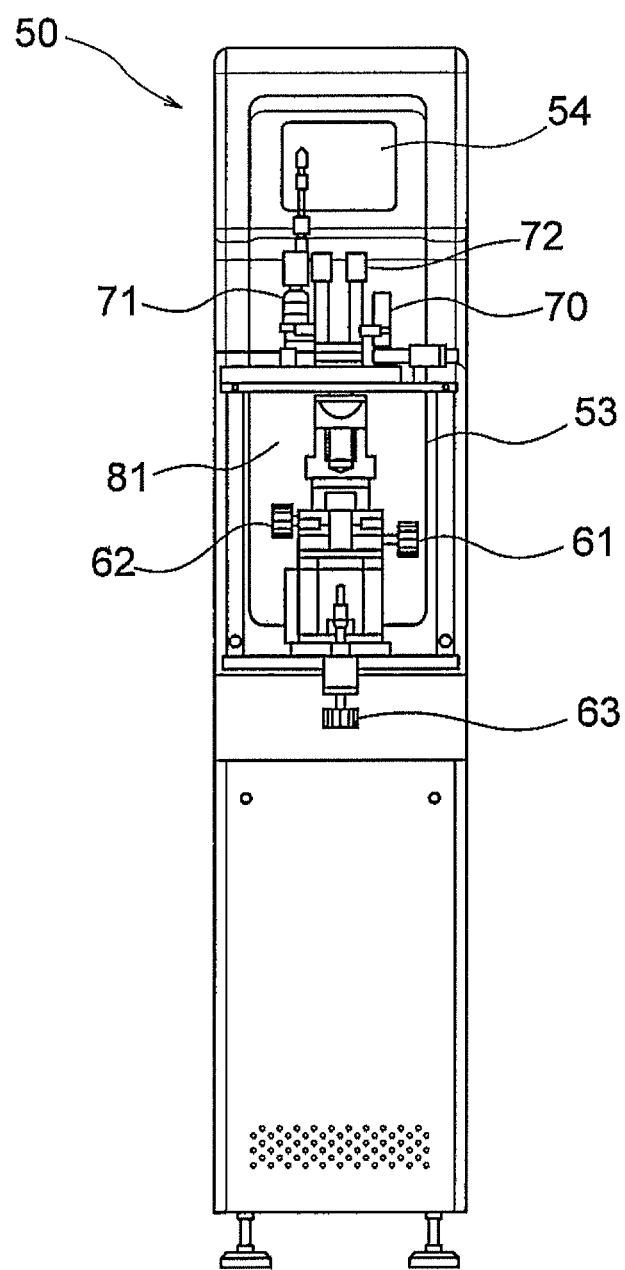
FIG. 12 is a front view of FIG. 11.

FIGS. 10 through 12 are diagrams for explaining the overall unit process apparatus of the present invention. As illustrated in the diagram, a unit process apparatus 50 is made up of a lower treatment apparatus 51, an upper treatment apparatus 52, and a coupling portion 60 that separably couples them, and is configured to move by portable devices 61 provided on the lower part. These unit process apparatuses have an identical external form, with the outer shape standardized to desktop size. Herein, "desktop size" is a size on the order at which a person can relatively easily carry it about, and is specifically set to x: 294 mm, y: 450 mm, Z1: 700 mm, and Z2: 740 mm.

The upper treatment apparatus 52 houses a wafer exposure apparatus as a treatment apparatus. In the lower treatment apparatus 51, control devices for controlling these apparatuses and similar device are disposed. On the lateral surface of the upper treatment apparatus 52, an inspection window 57 is formed. The inspection window 57 is constituted from a light shielding material having transparency, so that the exposure light for the photosensitive resist does not enter the treatment apparatus interior.

Further, a space of requisite size is disposed to hollow the upper treatment apparatus 52 along its front side toward depth side. An upper stage 55 is disposed facing this space.

On top of the upper stage 55, a docking port 56 for coupling to the conveyance container is provided. Beneath this docking port 56, a front chamber 80 is provided. That is, the upper treatment apparatus 52 is constituted by the front chamber 80 and a treatment chamber 81 that is coupled to the front chamber.

This front chamber 80 includes a conveyance apparatus (not-illustrated) that transfers a workpiece conveyed in from the docking port 56 to the front chamber 80 interior between it and the treatment chamber 81. At the same time, on the front side of the front chamber 80, a front-face panel 53 is detachably provided. By removing the front-face panel 53, maintenance of the conveyance apparatus or similar apparatus can be performed.

On top of the upper stage 55, switches including a power-source switch or similar switch are disposed. Above the front chamber 80, across a space therefrom, a display device 54 doubling as an operation panel is provided. Above the display device 54, a status display device 54' constituted of light emitting diodes or similar member for displaying the operational status of the unit process apparatus is provided.

Figure 2:
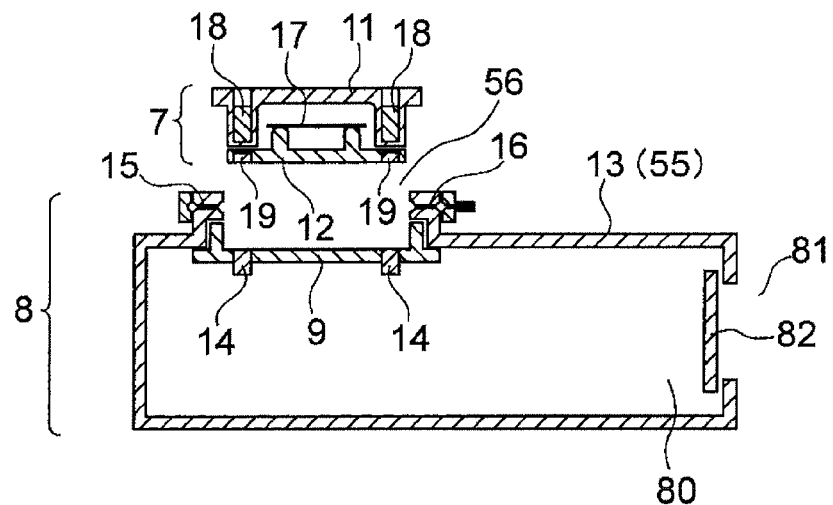
FIG. 2 illustrates a process for forming the coupling system between the conveyance container and the apparatus according to the present invention.
Figure 3:
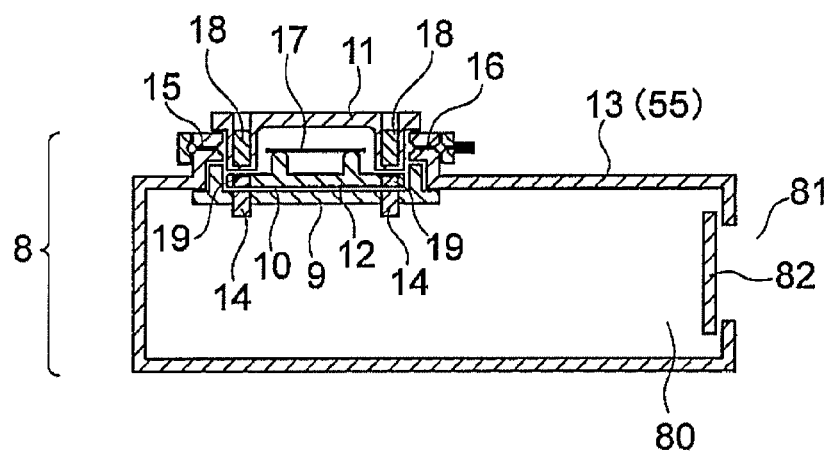
FIG. 3 illustrates a process for forming the coupling system between the conveyance container and the apparatus according to the present invention.
Figure 4:
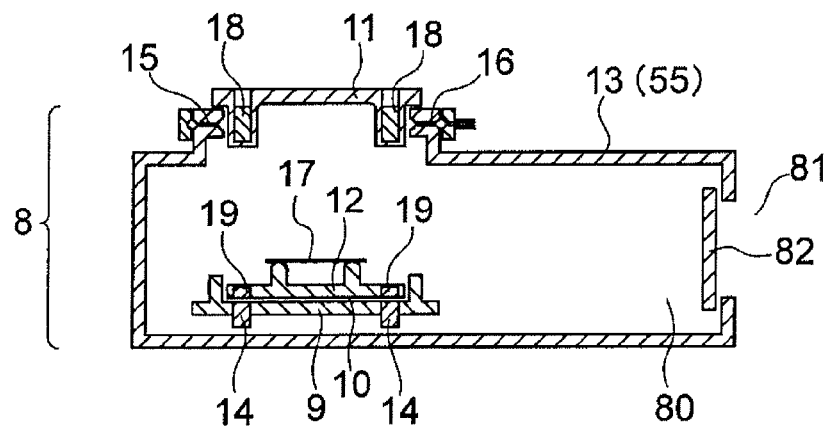
FIG. 4 illustrates a process for forming the coupling system between the conveyance container and the apparatus according to the present invention.

It should be noted that if it is necessary to spatially segregate the front chamber 80 and the treatment chamber 81, as illustrated in FIGS. 2 through 4, a shutter 82 can be provided for convenience, but the shutter 82 is not essential to the present invention.

The weight of the unit process apparatuses 50 differs according to the content of the treatment apparatuses that each unit process apparatus 50 includes, but standardly they are approximately 60 kilograms. Accordingly since they may be hauled easily utilizing the portable device 61 or similar device, the layout change among flow-shop and job-shop, multi-cell shop, class-shop layouts, and similar layout is facilitated.

Further, the upper treatment apparatus 52 has approximately a rectangular parallelepiped shape in desktop size, and a standard weight of approximately 30 kilograms. Accordingly, only the upper treatment apparatus 52 is easily hauled separately from the unit process apparatus 50 by the coupling portion 60. Thus separating the upper treatment apparatus 52 and moving it to a requisite place facilitates the inspection/repair, improvement, or similar work for the functions as the unit process apparatus 50.

As illustrated in FIG. 11 and FIG. 12, for this embodiment, an exposure apparatus is housed in the treatment chamber 81, and above a work table 65 on which the workpiece conveyed from the front chamber 80 is placed, a UV light source 70, a workpiece detection camera 71, and a monitoring camera 72 for alignment are arranged. Furthermore, these are configured so as to be selectively arranged in predetermined positions on the workpiece, by sliding in the left right directions set forth in FIG. 12. Accordingly in situations where the alignment is finished and the step transitions to the exposure step, the UV light source 70 is arranged on the work table 65, and the light is irradiated directly downward. Accordingly as illustrated in FIG. 11, a space in the vicinity of underneath the docking port 56 in the front chamber 80, that is, the space where at least the workpiece is conveyed is a space that is optically shielded from the UV light source 70.

Reference numbers 61, 62 and 63 are, respectively, x-, y- and z-axis adjusting mechanisms of the work table 65.

FIG. 1(c) is a diagram in which a conveyance container 7 and a front chamber 8 (same as the front chamber 80) that constitute a coupling system of the present invention are air-tightly coupled together. As described above, as a result of air-tight coupling between the conveyance container 7 and the front chamber 8, a coupling chamber 10 that is defined by a container door 12 of the conveyance container 7 and a front-chamber door 9 of the front chamber 8 is formed to fulfill the role of a front chamber in conventional coupling systems.

A front chamber in conventional technology functions in order to couple the external air and an apparatus interior under different environments, for example, under atmospheric pressure and under reduced pressure, or under atmospheric pressure and under a specified atmosphere, so as to carry an object housed in a conveyance container into the apparatus interior.

In contrast, in the present invention, with the above-described coupling chamber 10 as if this sort of front chamber is used, the environment in the coupling chamber 10 interior can be adjusted from the same environment as that of the exterior directly after tight coupling so as to be the similar atmosphere to the atmosphere inside the front chamber through a gas supplying port 15 and a gas discharging port 16 that are coupled to the coupling chamber in the interval until the container door 12 and the front-chamber door 9 become integral and are moved toward the inside of the front chamber to open the two doors.

For what is associated with processes for treatment under a vacuum like semiconductors, particularly, this sort of supply and discharge of cleaning gas are demanded. In this case, in manufacturing facilities utilizing apparatuses that differ per each of the plurality of processes, the respective apparatuses employed in the processes each require a coupling system of the present invention.

If the atmosphere within an apparatus is a vacuum, the gas inside of the coupling chamber 10 is discharged from the gas discharging port 16 by a vacuum pump or similar method, subsequently if necessary, an inert gas is introduced into the coupling chamber from the gas supplying port 15, and then the operation for discharging this gas from the gas discharging port 16 is repeated an arbitrary number of times. This allows putting the environment inside the coupling chamber 10 containing fine particles at the same level as that of the environment inside the front chamber.

Of course, in accordance with the objective level of cleanness and the atmosphere within the front chamber, if necessary, the environment within the coupling chamber 10 can be made to approach the environment within the front chamber.

In this way, the present invention enables tight coupling of a conveyance container directly to a front chamber. Therefore, the gas supplying port 15 and gas discharging port 16 can be provided in the front chamber 8 such that these ports are connected in the coupling chamber 10 formed by the tight coupling.

To circulate the gas within the coupling chamber 10 so as to clean the inside by these ports, it is necessary that the gas circulate entirely throughout the coupling chamber 10 and it is also necessary that the gas circulate so as to remove particles or similar material attached to the opening portion in the conveyance container 7 and the opening portion in the front chamber 8 where the container door 12 and the front-chamber door 9 have been in close contact with each other.

The details of the tight coupling between the conveyance container 7 and the front chamber 8 utilized in the coupling system of the present invention will be described as follows, giving the example of introducing a wafer 17 for manufacturing semiconductor devices into the apparatus. The example is not limited to this. For example, microorganism cultures or unstable chemical compounds can be introduced.

In FIG. 2, the conveyance container 7 is formed of a conveyance-container main body 11 and a container door 12. The conveyance-container main body 11 and the container door 12 are air-tightly sealed by publicly known sealing means. Accordingly, the conveyance container 7 interior is shielded from exposure lights. The conveyance-container main body 11 includes a member that supports the wafer 17 from the container door 12 toward the interior of the conveyance-container main body 11.

Taking into consideration the container 7 and the front chamber 8 after having been tight coupled, the conveyance container 7 can be provided with a magnet 18 on a wall portion of the conveyance-container main body 11, and a magnetic material 19 such as iron can be provided in a location of the container door 12 that abuts the wall portion of the conveyance-container main body 11. In that case, the locations where the wall portion of the conveyance-container main body 11 and the magnetic material 19 in the conveyance container door 12 are provided are extended, and an electromagnet 14 is arranged in a location of the front-chamber door 9 that abuts with the location of the conveyance container door 12 where the magnetic material 19 is provided.

In the state of FIG. 2, as for the conveyance container 7, the conveyance-container main body 11 powerfully adheres tightly to the container door 12 under magnetic force, and the interior of the conveyance-container main body 11 is securely shielded from the external air. The front-chamber door 9 of the front chamber 8 is tightly adhered to the front-chamber main body 13 securely by whatever means. Also, the front-chamber main body 13 is reliably shielded from the external air.

It should be noted that as described above, in the front chamber 8 (that is, the front chamber 80 in the unit process apparatus), a partitioning door 82 for spatial partition from the treatment chamber 81 as needed is provided at the coupling portion with the treatment chamber. This is provided in cases where, for example, it is necessary to prevent the direct irradiation of the exposure light from the treatment chamber 81 onto the workpiece within the front chamber 80. However, when there is no such risk, the partitioning door 82 is not necessarily required. In situations where the partitioning door 82 is not provided, the front chamber 80 and the treatment chamber 81 have the same environments such as atmospheric pressure. Therefore, placement of the conveyance container 7 on the docking port 56 in the upper part of the front chamber 80 will be the same as direct coupling between the conveyance container 7 and the treatment chamber 81.

From the state as in FIG. 2, next, as illustrated in FIG. 3, the conveyance container 7 with the container door 12 directed downward is placed so as to overlap front-chamber door 9 of the front chamber 8. In that situation, it is important to accurately overlap the conveyance container 7 and the front chamber 8 by, for example, providing an alignment pin in one of either the conveyance container 7 or the front chamber 8 while providing a hole for fitting over the alignment pin. The mechanism for aligning is not limited to a pin, adopting a publicly known aligning means is possible.

The front-chamber main body 13 and the front-chamber door 9 are also sealed airtight by publicly known sealing means. Accordingly, with the front-chamber door in a closed-door state, the front chamber interior is shielded from the exposure light.

After the conveyance container 7 has been placed in the accurate position on the front chamber 8, an operation to tightly coupling the two is carried out. If a tight coupling is not performed, the conveyance container 7 and the front chamber 8 are not sealed airtight and a clearance is to be formed between them. When the door is opened in that state, external air invades into the conveyance container 7 and into the front chamber 8, and their interiors become contaminated with the external air, fine particles, and similar material.

As the means for tight-adhere coupling, a publicly known means such as a latching mechanism is satisfactory. For the tight-adherence strength, strength to an extent that a seal of a gasket or other publicly known sealing means interposed between the conveyance-container main body 11 and the front-chamber main body 13 functions effectively is favorable. This tight-adhere coupling ensures a structure where the exposure light does not escape from the tightly adhering areas.

After the conveyance container 7 and the front chamber 8 have been tightly adhered, an airtight sealing structure is formed by a publicly known sealing means provided in any one or both of the conveyance-container main body 11 and the front-chamber main body 13. Then, to set the environment in the coupling chamber 10 formed between the container door 12 and the front-chamber door 9 partitioned by the sealing means to be the same as the environment within the front chamber, the gas supplying port 15 and the gas discharging port 16 provided in the front chamber in advance are utilized to adjust the environment within the coupling chamber 10.

A specific adjusting method is to reduce the pressure by exhausting the air within the coupling chamber 10 whose environment initially is the same as the external air through the gas discharging port 16. Subsequently, an adoptable method includes introducing, for example, desiccated nitrogen gas from the gas supplying port 15 and then exhausting it through the gas discharging port 16 to reduce the pressure, as well as a method for repeating this method.

According to such methods, in the coupling chamber 10 initially under the same environment as that of the external air and where contaminant substances such as fine particles other than reactive gases such as oxygen exist, the fine particles and similar material removable by gas flows due to exhausting and supplying gases are removed. Also, the reactive gases such as oxygen are discharged at the same time.

Thereafter the environment is adjusted to be the same as the environment inside the front chamber 8. That is, if the front chamber 8 interior is at reduced pressure, the coupling chamber 10 is adjusted to be also at reduced pressure. If the front chamber 8 interior is under an inert-gas atmosphere, the coupling chamber 10 is also adjusted to be under an inert-gas atmosphere. Of course, adjustment of the environment within the coupling chamber 10 may be performed by a different process.

This adjustment of the environment within the coupling chamber 10 is not particularly changed from adjustment that has taken place in front chambers in conventional apparatuses (that is, front chambers physically spaced apart from the treatment chamber). However, compared with conventional front chambers, the space within the coupling chamber defined by the doors of both the conveyance container 7 and the front chamber 8 or similar member is overwhelmingly small. Accordingly, it is sufficient that the apparatuses required to supply and exhaust the gases be smaller-scale apparatuses and a far shorter period of time is enough for the requisite amount of time.

In addition, a description will be given of a method for moving the wafers housed within the transport container 7 to the front chamber 8 interior.

Although not illustrated in the figures, a device such as an elevator for opening/closing the front-chamber door 9 is provided within the front chamber 8. The wafer fixed to the container door of the conveyance container 7 is transported to the inside of the front chamber 8 along with the container door 12 and the front-chamber door 9 to undergo treatment by treatment means within the apparatus.

When the container door 12 and the front-chamber door 9 that are integrated together are moved to the inside of the front chamber 8, the tight adherence between the container door 12 and the conveyance-container main body 11 is released.

As an example of means for this releasing, the following means may be given.

The magnetic material 19 provided on the container door 12 adheres magnetically to the magnet 18 while receiving the magnetic force of the magnet 18 provided on the wall of the conveyance-container main body 7.

Accordingly, in order to release the container door 12 from the conveyance-container main body 11, it is necessary to apply force to the magnetic material 19 against the magnetic force from the magnet 18 acting on the magnetic material 19 in the releasing direction of the container door 12.

In FIG. 3, by passing a current into the electromagnet 14 provided on the front-chamber door 9, magnetic force is applied to the magnetic material 19. Thus, the magnetic force acting on the magnetic material 19 becomes stronger by the electromagnet 14 rather than by the magnet 18. As a result, a closed magnetic circuit is formed so as to magnetically adhere the container door 12 to the front-chamber door 9.

By moving the front-chamber door 9 downward in a state in which the container door 12 is magnetically adhered to the front-chamber door 9 in this way, as indicated in FIG. 4, the front-chamber door 9 and the container door 12 are together entered into the front chamber interior. The passing of electricity into the electromagnet may be halted at the point when the magnetic force from the magnet 18 into the container door 12 has weakened to a certain extent.

In this state, the coupling chamber 10 constituted from the front-chamber door 9 and the container door 12 communicates with the space inside the front chamber 8. However, since the coupling chamber 10 is already under an environment that is the same as the environment within the front chamber 8, contamination within the front chamber originating in the coupling chamber 10 is not to be seen.

It should be noted that this example is an instance in which the gas supplying port 15 and the gas discharging port 16 are provided on the front chamber 8, but in some cases these ports need not be provided. Such a case is where comparing the volumetric capacity of the front chamber 8 with the volumetric capacity of the coupling chamber 10, the internal volume of the coupling chamber 10 is overwhelmingly small such that even supposing that fine particles and gases present in the coupling chamber 10 were to mix into the atmosphere within the apparatus, the level of contamination would be extremely small such as to be ignorable.

In that case, in order to have environments such as atmospheric pressure in the formed coupling chamber 10 and inside the front chamber 8 be the same, an open/closable channel communicating the front chamber 8 interior and the coupling chamber 10 interior may be provided on the front-chamber door 9, so that after the conveyance container 7 and the front chamber 8 have tightly adhered so as to form the coupling chamber 10, opening this channel communicates the coupling chamber 10 and the front chamber 8 interior.

Furthermore, it is possible to have the orientation of the front chamber 8 and the front-chamber door 9 of the above-described embodiment example be directed sideways or downward, and container door 12 of the conveyance container 7 be directed sideways or upward.

A different mechanism for opening/closing the container door and the front-chamber door will be described based on FIG. 5.

Figure 5:
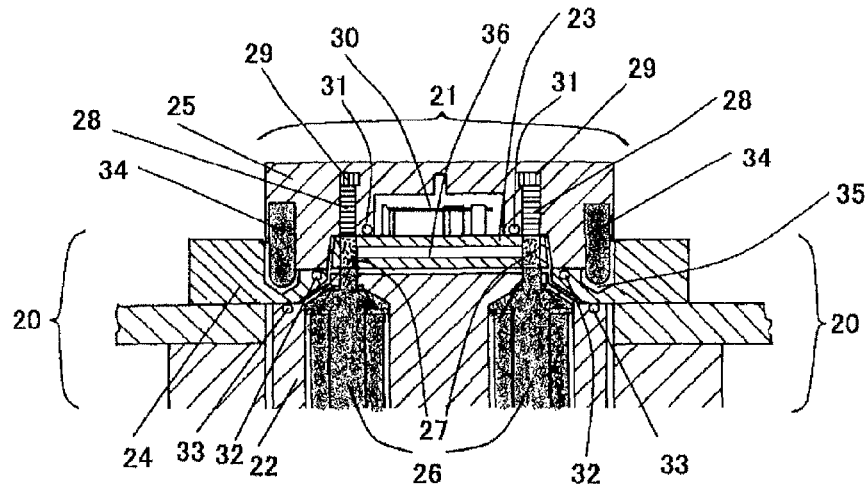
FIG. 5 illustrates a device for opening/closing a conveyance-container door by forming a closed circuit of a magnetic force.

FIG. 5 is a diagram of a state in which a conveyance container 21 is tightly adhered to a front chamber 20, and a container door 23 opposes the upper surface of the front-chamber door 22, and a portion of the conveyance-container main body 25 around the container door 23 opposes the front-chamber main body 24.

In the front-chamber door 22, an electromagnet 26 is embedded and the leading edge thereof is exposed onto the upper surface of the front-chamber door 22. Magnetic materials 27 are embedded penetrating the container door 23 from its front surface to its rear surface so as to oppose a position on the leading edge of the electromagnet 26. The magnetic materials 27 are embedded as a plurality, and this plurality of magnetic materials 27 is coupled to either end of a magnet 36 by magnetic force. Then, one or more sets composed thus of two magnetic materials 27 and a magnet 36 are embedded.

Furthermore, on the inner side of the container door 23, that is, in locations where the magnetic materials 27 are exposed on the conveyance-container main body side, magnetic materials 28 embedded in the conveyance-container main body 25 exert magnetic force. The container door 23 is fixed to the conveyance-container main body 25 by the attractive force from the magnetic force produced between the magnetic materials 27 embedded inside and the magnetic materials 28 embedded in the conveyance-container main body 25. Therefore, the interior of the conveyance-container main body 25 is hermetically sealed by the container door 23.

The plurality of magnetic materials 28 embedded in the conveyance-container main body 25 are coupled by a magnetic material 29 in locations separated from areas opposing the container door 23. In that state, the magnetic force couples the container door to the conveyance-container main body so as to form a closed circuit.

Inside the conveyance-container main body 25, a treatment target object 30 is housed. The treatment target object 30 is fixed to the container door 23 to be movable together with the container door 23 between it and the front chamber 20 interior. In order to have the treatment target object be movable within the front chamber or within the container while preventing the invasion of external air and invasion of fine particles into the front-chamber main body 24 or conveyance-container main body 25, the conveyance container 21 and the front chamber 20 need to closely adhere so as to form a coupling chamber that is airtight with respect to the external air.

For that purpose, in FIG. 5, a sealing member 31 such as an O-ring for air-tightly sealing between the conveyance-container main body 25 and the container door 23 is provided, a sealing member 33 such as an O-ring for air-tightly sealing between the front-chamber main body 24 and the front-chamber door 22 is provided, and a sealing member 32 such as an O-ring for air-tightly sealing the conveyance-container main body 25 and the front-chamber main body 24 is provided. These sealing members enable the interior of the conveyance container 21 and the interior of the front chamber 20 to enter into a state in which the interiors are shielded from the external air, of course when the conveyance container 21 is coupled to the front chamber 20, but also when it is not.

Furthermore, to enable the conveyance container 21 to couple accurately to the front chamber 20, and the treatment target object 30 inside the conveyance container 21 to traverse the interior of the front-chamber main body 24 and be accurately treated, it is necessary to accurately fit a plurality of alignment pins 34 provided in the conveyance-container main body 25 into a plurality of holes or grooves provided in the front-chamber main body 24 or similar measure. While of course the alignment pins may be provided on the front chamber side and the holes or grooves provided on the container side, taking operability into consideration it is preferable that the alignment pins be provided on the container side and the holes or grooves be formed on the front chamber side so as to fit together with the alignment pins.

The shape of the tips of the alignment pins 34 may be globular, conical or pyramidal insofar as the pins have distinct tips. The holes or grooves 35 may have an innersurface shape reflecting the shape of the tips of the alignment pins so as to fit together with the alignment pins 34. In particular, V-shaped grooves or U-shaped grooves are preferable. At this time, two points near the tips of the alignment pins 34 may be made to come into contact with two points near the bottom parts of the holes or grooves 35. Then, for example, in the case where the tips of the alignment pins 34 are globular and the holes or grooves are V-shaped grooves, the globular portion of the tip of the alignment pins may be positioned into the center part of the V-shaped grooves 35. Such aligning means enable the conveyance container 21 to be accurately and securely coupled to the scheduled position in the docking port 56 of the front chamber 20.

Although not illustrated in FIG. 5, a gas supplying port and a gas discharging port as represented in FIG. 2 are provided in the front chamber 20. The interval between the conveyance-container main body 25 and the front-chamber main body 24 is sealed airtight by a sealing member 32. Therefore, filling the coupling chamber with any gas as well as putting the coupling chamber under any pressure are possible so as to accord the coupling chamber formed between the front-chamber door 22 and the container door 23 with the atmosphere inside the front chamber 20 and the conveyance container 21.

In FIG. 5, the shape of the container, the front chamber and their doors, the shape of the electromagnet, the shape of the magnetic materials, and the pins and holes or grooves are not limited to what is illustrated in the drawings. Insofar as the same functions are demonstrable, they may have any shapes. Also, it is possible to have the electromagnet 26 be a magnet instead.

Further, as illustrated in FIGS. 2 through 4, the apparatus illustrated in FIG. 5 is one in which the container door is moved together with the front-chamber door into the front chamber, and where predetermined treatment take place within the front chamber.

Figure 6:
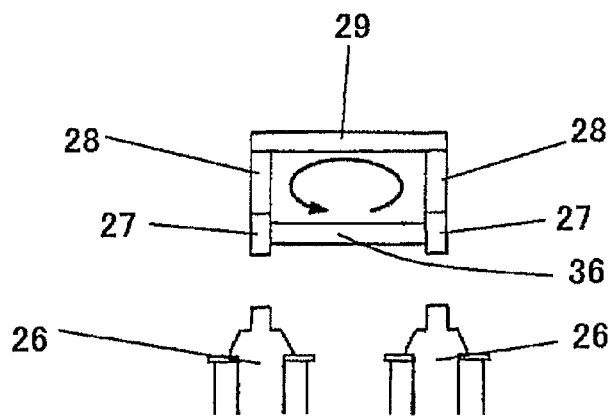
FIG. 6 is a schematic diagram in a state where the closed circuit of the magnetic force is formed on the conveyance container side in the apparatus illustrated in FIG. 5.

In the state illustrated in FIG. 5 and the state in which the conveyance container is positioned in a place separated from the front chamber, only the relationship between the respective magnetic materials and electromagnet is illustrated in FIG. 6.

In FIG. 6 the conveyance container is positioned in a place separated from the electromagnet, and the electromagnet does not have electromagnetic force. Meanwhile, in the conveyance container, two magnetic materials 27 coupled together by the magnet 36 embedded in the container door are present. The magnetic materials 28 provided on the conveyance-container main body are coupled to the respective the magnetic materials 27. Further, these magnetic materials 28 are coupled together by the magnetic material 29. As a result of this coupling, a circuit is formed by the magnetic forces from the respective magnetic materials, in the direction of the arrow as illustrated in FIG. 6.

Figure 7:
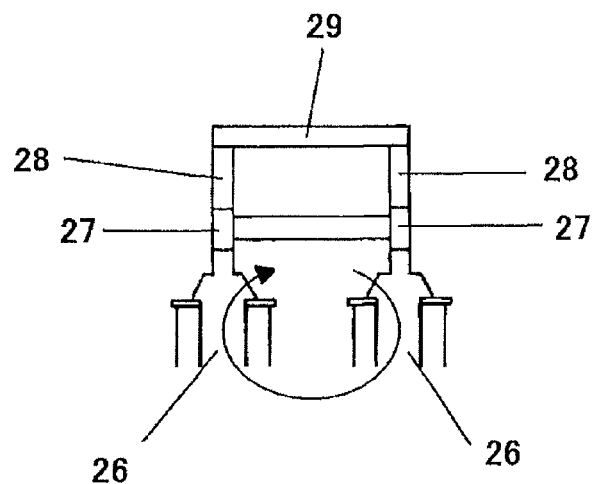
FIG. 7 is a schematic diagram in a state where the closed circuit of the magnetic force is formed over the conveyance-container door and the apparatus in the apparatus illustrated in FIG. 5.

Likewise, FIG. 7 illustrates the relationship between the magnetic materials and the electromagnet in a state in which the container door has not yet been opened when magnetic force from the electromagnet 26 has been generated after the conveyance container has been coupled to the front chamber.

At first, when current is flowed into the electromagnet 26 and electromagnetic force is generated, the magnetic force lines directed toward the magnetic materials 28 inside the magnetic materials 27 prior to this magnetic force generation stops being directed toward the magnetic materials 28 under the magnetic force of the electromagnet. Then, the magnetic force lines are redisposed in the direction of the electromagnet. As a result, a magnetic circuit from magnet 36 to magnetic material 27 to electromagnet 26 to electromagnet 26 to magnetic material 27 is formed. The magnetic materials 27 and the electromagnet 26 thereby come to possess strong attractive force. This fact means that in the magnetic circuit constituted with the conveyance-container main body 25 and the container door 23, the magnetic lines between the magnetic materials 27 and the magnetic materials 28 weaken considerably, such that as an actual magnetic circuit it is severed. That is, with the attractive force between the magnetic materials 27 and the magnetic materials 28 growing extremely weak, the magnetic lock between the conveyance-container main body 25 and the container door 23 is released.

In the manner above, generating magnetic force through the electromagnet releases the magnetic lock between the conveyance-container main body and the container door, and the electromagnet and the container door are magnetically locked. Thus, the container door can be opened.

In this way, since opening/closing of the container door and opening/closing of the front-chamber door can be carried out at the same time by the action of the electromagnet. This allows preventing external air and external fine particles from flowing into the inside of the container and the inside of the front chamber. At this time, a closed magnetic circuit is formed both before and after the opening/closing of the container door. This eliminates escaping of magnetic force to the exterior.

Figure 8:
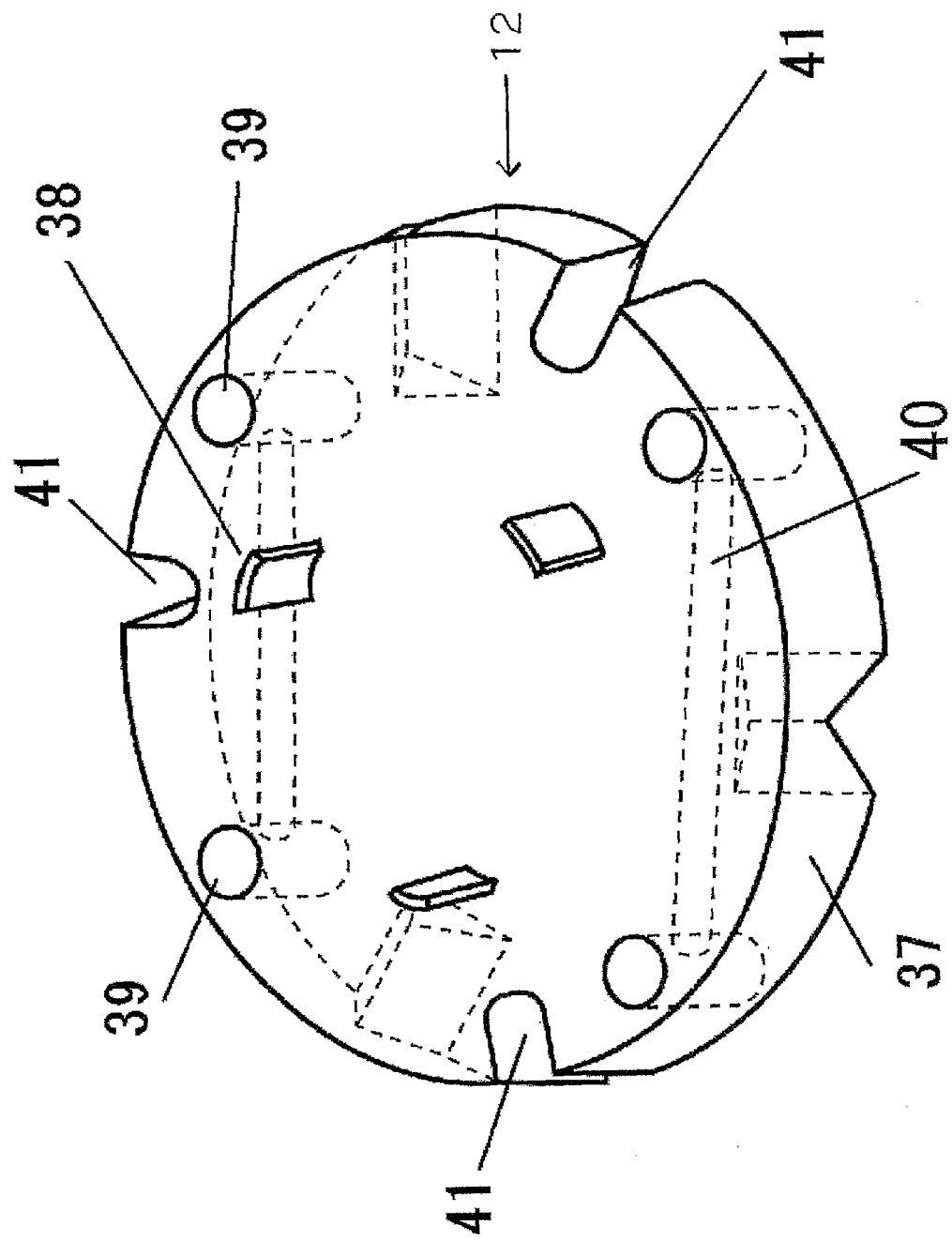
FIG. 8 is a perspective view of the conveyance-container door according to the present invention.

FIG. 8 illustrates a schematic diagram of a structure viewed from the inner side of the conveyance-container door.

This container door 12 is configured such that the door is embedded in an opening portion of the conveyance container 11 to be closed. The container door 12 has a disk shape that has an inclined surface 37 non-vertical to the top and inferior surfaces of the container door 12 in the whole circumference. On the inner side of the container door 12, three stops 38 for holding a conveyance target object (not illustrated). For example, a conveyance target object in a circular plate shape is placed on or fitted to these stops 38 to be held. On the exterior surface of this container door 12, grooves 41 are disposed.

In this container door 12, magnetic materials 39 and magnets 40 are embedded.

Figure 9:
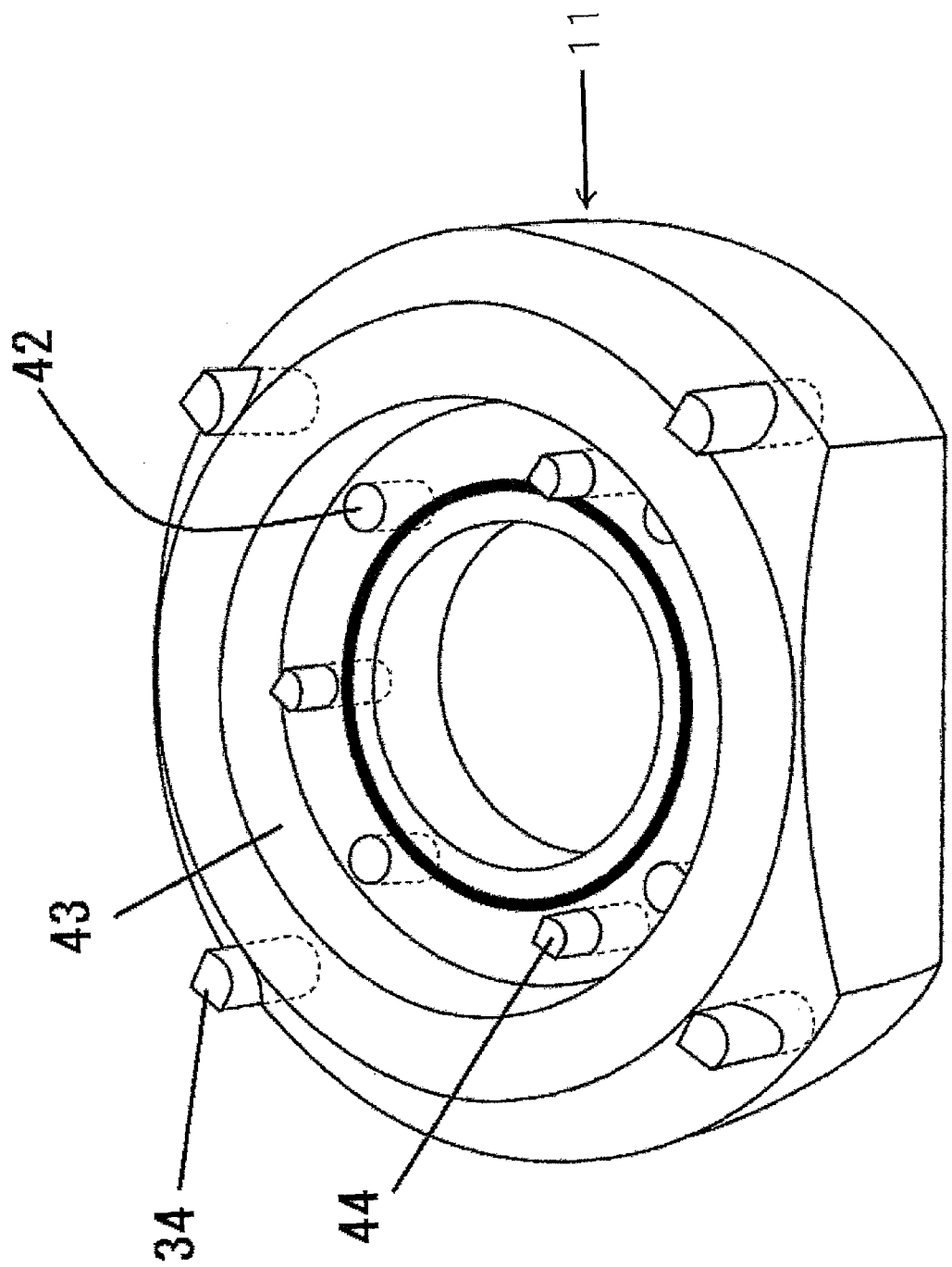
FIG. 9 is a perspective view of the inner side of the conveyance container according to the present invention.

Based on FIG. 8 and FIG. 9, a description will be given of a process for closing the container door 12 with respect to the conveyance-container main body 11

After the conveyance target object (not illustrated) is held by the stops 38 of this container door 12, the container door 12 is fitted to the conveyance-container main body 11 that includes alignment pins 34 with respect to the front chamber to enclose the conveyance target object in this conveyance container 11. In this case, the conveyance-container door illustrated in FIG. 8 is flipped upside down so as to fit the inclined surface 37 of this container door 12 to an inclined surface 43 on the inner side of the conveyance container 11. At this time, the grooves 41 disposed in the peripheral area of this container door 12 engage with pins 44 disposed inside of the conveyance container. Additionally, at the same time, the inclined surface 37 that is disposed in the peripheral area of the conveyance-container door and disposed conforming to the inclined surface 43 approaches the inclined surface 43 forming the inner surface of this conveyance-container main body to be gradually brought into contact with the inclined surface 43. Consequently, this conveyance-container door is fitted to this conveyance-container main body, and the inclined surfaces 37 and 43 are brought into contact with each other at the same time.

Furthermore, as described above, the magnetic materials 39 of this container door 12 are arranged to face the magnetic materials 42 disposed inside of the conveyance-container main body 11. At this time, the magnetic field lines of the magnets 40 are oriented in the direction of the magnetic materials 42 through the magnetic materials 39. Accordingly, the magnetic materials 42 on the conveyance-container main body 11 side is attracted to the magnetic materials 39 on this conveyance-container door side by magnetic force. Thus, this container door 12 is fixed to this conveyance-container main body 11.

Accordingly, the conveyance container and the front chamber of this unit process apparatus are air-tightly coupled together. Only two doors are required for moving the content between these members. One is the door of the container and the other is the door of the front-chamber main body. These two doors have shapes that can form the coupling chamber only while the conveyance container and the front chamber are air-tightly coupled together. Originally, since the inner surface of this coupling chamber is formed by the exterior surfaces of the two doors, the inner surface is a surface that may be exposed to the external space and contaminated. Accordingly, in the case where the coupling chamber is formed and a cleaning mechanism for the inside of the coupling chamber is disposed, this configuration can ensure more cleanliness and realize the separation between the internal space and the outside. The internal space is formed by the inner portion of the conveyance container, the inner portion of the front chamber, and the coupling chamber.

A description will be given of the case where the unit process apparatus is constituted as an application apparatus for photosensitive material.

In the conventional yellow room, even when photosensitive material is supplied to the application apparatus installed within the room, there is no possibility that the photosensitive material to be supplied is not exposed because the entire room is shielded. However, for the yellow room of the present invention, even though the photosensitive material is introduced in the shielded container, the lid of the container needs to be opened when the container is set within the apparatus. Accordingly, at that time, the leakage of light may expose the resist inside. Thus, the need exists for devising a countermeasure.

With the present invention, the photosensitive material is sealed by a bottle-shaped container (not illustrated) made of the material that shields the exposure light so as to be supplied to the unit process apparatus 50. The lower treatment apparatus 51 of the unit process apparatus 50 includes the housing space for the container. The container is inserted into the housing space.

In the upper treatment apparatus 52, what is called a spin coater that includes a workpiece placing table, a spitting nozzle, and a rotation unit (all not illustrated) is arranged. The spitting nozzle put a drop of the photosensitive material on the workpiece (wafer) on the workpiece placing table. The rotation unit rotates the workpiece placing table. In the case where the inspection window 57 is disposed at the upper treatment apparatus 52, the inspection window 57 is constituted of the material that shields the exposure light.

Further, in the housing space of the lower treatment apparatus 51, the end portion of the hose for supplying the photosensitive material to the spitting nozzle is arranged as an electrical outlet. This hose is also constituted of the material that shields the exposure light.

On the container, a plug-in type resist supplying connector is mounted. This connector is closed when the container is provided alone, and has a structure in which a pipe is opened to be mounted to the electrical outlet. The connector itself is constituted of a light-shielding member. This plug-in connector itself may employ a well-known configuration.

However, this plug-in connector causes a problem that fine particles are generated due to the friction during removal/mounting of the connector and mixed with the resist material. In order to prevent this problem, in the present invention, a fine-particle removal filter is mounted from the electrical outlet side to the spitting nozzle. The above-mentioned structural function eliminates the need for light-shielding circumference environment during mounting of the resist container.

As described above, the "singular treatment process" performed by the unit process apparatus 50 means one unit of treatment processes that can be housed within the volume of one desktop-size container. This meaning will be described using an example.

The actual wafer process for semiconductor device mainly includes processes of cleaning, application, exposure, developing, etching, deposition (such as CVD and sputtering), impurity control (such as ion implantation and diffusion), inspection, CMP (polishing), and similar process. Each process includes more detailed element processes. For example, the cleaning process for silicon wafer is an inclusive term for the following process group.

(1) ultrapure water cleaning (rough cleaning), (2) SPM (Sulfuric acid-Hydrogen Peroxide Mixture) cleaning (organic matter removal), (3) ultrapure water cleaning (rinsing), (4) $NH_4OH$—$H_2O_2$—$H_2O$ (SC-1) cleaning (particulate removal), (5) diluted hydrogen fluoride cleaning (attached particulate removal by oxide removal), (6) $HCl$—$H_2O_2$—$H_2O$ (SC-2) cleaning (metal atom removal), (7) diluted hydrogen fluoride cleaning (oxide removal), (8) ultrapure water cleaning (rinsing), (9) IPA (Isopropyl Alcohol) vapor drying (water vapor removal)

According to the exemplary embodiment, one unit process apparatus may perform this sequence of cleaning processes of (1) to (9), or two unit process apparatuses may be configured such that one unit process apparatus performs the organic matter removal of (1) and (2), and the other unit process apparatus performs the particulate removal and the metal atom removal of (3) to (9).

An application process, which is an example of another process in the semiconductor process, is an inclusive term for (a) surface treatment, (b) resist application, and (c) prebake (resist hardening). In these processes, (a) is a hydrophilicity/hydrophobicity control process of the wafer surface. Thus, the surface treatment (a) can be performed by the unit process apparatus which performs (3) to (9) in the cleaning process described above.

As described above, according to the present invention, the unit process apparatus basically brings together the element processes which perform similar processing methods, and handles those processes in one unit process apparatus. Even though the processing methods are very different from one another, one unit process apparatus 1 may handle two consecutive processes insofar as it is technically advantageous that those two consecutive processes are handled in the same apparatus.

For example, it is preferred that the IPA vapor drying process (9) after the rinsing process (8) in the above-described cleaning process be performed in one unit process apparatus after the process (8), when possible. It is because residual moisture on the wafer has an action to etch atoms on the wafer surface in the atomic scale. This causes a problem that etching residue condenses as a watermark if it is left as it is. In order to prevent this problem, the IPA vapor drying needs to be performed before the etching proceeds.

An object which is processed by this unit process apparatus is a semiconductor device in a minimized unit, which has a wafer size for manufacturing one semiconductor device from the wafer in 0.5 inch size according to an exemplary embodiment. One wafer is processed at a time. In other words, the process in the level similar to that of the semiconductor treatment apparatus in an experiment phase is performed. Accordingly, even a research and development achievement in the experiment phase in a research laboratory can be easily introduced as a treatment apparatus in the unit process apparatus.

The present invention facilitates transportation, positioning tasks, or similar tasks for the unit process apparatus, which are associated with a layout change of this unit process apparatus 50. This can flexibly handle the varied number of the unit of manufacturing. That is, a layout can be changed extremely easily among the flow shop layout, the class shop layout, and the multicell shop layout. This enables each manufacturing apparatus not to be in a non-operational state, and a flexible device manufacturing system, which is tolerant of economic change or economic upturn and downturn, can be easily achieved. The configuration for coupling each unit process apparatus to outside, the configuration of the conveyance means for conveying the conveyance container, or the configuration for arranging the unit process apparatuses can be also standardized for example. This allows reducing the cost of the device manufacturing apparatus itself. Furthermore, a conveyance control of the conveyance container can be also simplified or streamlined. Furthermore, a workpiece object is one wafer for one device for single wafer processing. This allows simplifying the unit process apparatus, the conveyance container, the conveyance means, and similar unit. This allows the manufacturing line to be established at a far lower price.

With the present invention, the yellow room system and the local cleaning system are both provided. The unit process apparatus and the inside of the conveyance system are sealed from the work space for operators. This eliminates the need for a clean room or a yellow room which houses the entire device manufacturing apparatus and improves the operation efficiency of operators. Moreover, since the wafer to be treated has a wafer size in a minimized unit and there is no need for a conventional clean room or a yellow room, the energy efficiency for manufacturing is extremely better than a conventional megafab.

More specifically, the apparatus installation of groups of application, exposure, and developing equipment to be set in a yellow room has been a quarter of the overall area of the front-end process. On the other hand, with a yellow room system constituted like the present invention, the volume in which light needs to be controlled can be reduced to approximately 1/30 or less of the conventional configuration.

REFERENCE SIGNS LIST 1 conventional conveyance container
2 front chamber of conventional apparatus
3 main body of conventional conveyance container
4 container door of conventional conveyance container
5 main body of conventional apparatus
6 apparatus door of conventional apparatus
7, 21 conveyance container
8, 80, 20 front chamber
9, 22 front-chamber door
10 coupling chamber
11, 25 conveyance-container main body
12, 23 container door
13, 24 front-chamber main body
14, 26 electromagnet
15 gas supplying port
16 gas discharging port
17, 30 treatment target object (wafer)
18, 36 magnet
19, 27, 28, 29, 39, 42 magnetic material
31, 32, 33 sealing member
50 unit process apparatus
51 lower treatment apparatus
52 upper treatment apparatus
54 operation panel
55 upper stage
56 docking port
57 inspection window
60 coupling portion
61 portable device
80 front chamber
81 treatment chamber

The invention claimed is:

1. A yellow room system, comprising:
a plurality of portable unit process apparatuses that are sealed-type treatment apparatuses configured to perform a single treating process in a device manufacturing process and have a same standardized outer shape, the unit process apparatuses including a light-shielding area configured to shield an exposure light to a photosensitive material formed on a workpiece;
a conveyance container that is a sealed-type conveyance container configured to house a wafer as a workpiece target and convey the workpiece between the unit process apparatuses, the conveyance container being formed to shield the exposure light; and
a light-shielding coupling structure that couples the unit process apparatuses and the conveyance container together, wherein
the wafer housed in the conveyance container has a wafer size for manufacturing a device in a minimized unit.

2. The yellow room system according to claim 1, wherein the conveyance container includes: a conveyance-container main body that forms a housing space for the workpiece; a conveyance-container door configured to shield the housing space; and a first sealing structure configured to seal the housing space by tight coupling between the conveyance-container main body and the conveyance-container door, each of the conveyance-container main body, the conveyance-container door, and the first sealing structure being formed of a member configured to shield a exposure light to the photosensitive material formed on the workpiece,
the unit process apparatuses each include: a front chamber to be coupled to the conveyance container; and a treatment chamber to be coupled to the front chamber,
the front chamber includes: a front-chamber main body formed of a member configured to shield the exposure light; an opening portion disposed at the front-chamber main body, the opening portion being opened to the treatment chamber; a front-chamber door configured to shield the front-chamber main body from the exposure light; and a second sealing structure configured to seal the front chamber by tight coupling between the front-chamber door and the front-chamber main body and configured to shield the exposure light, and the conveyance container and the front chamber have a third sealing structure configured to: ensure sealing by tight coupling between the conveyance container and the front chamber; and shield the exposure light, the conveyance container and the front chamber having a structure configured to form one indivisible coupling chamber sealed by the third sealing structure only while the conveyance container and the front chamber are tightly coupled together so as to separate the conveyance-container door from the conveyance container.

3. The yellow room system according to claim 2,
wherein a work area and a conveyance area for the workpiece are configured to shield the exposure light, the work area including at least a treatment position of the workpiece within the treatment chamber, the conveyance area being disposed from the work area to a door opening position of the conveyance-container door.

4. The yellow room system according to claim 3, further comprising
a structure configured to open the conveyance-container door by attracting the conveyance-container door to the front-chamber door using a magnetic force of a magnet of the front-chamber door.

5. The yellow room system according to claim 3,
wherein the unit process apparatuses are sealed-type treatment apparatuses configured to perform a singular treatment process in a device manufacturing process, the unit process apparatuses being portable,
the conveyance container is a sealed-type conveyance container configured to house one wafer as a workpiece target, and
the wafer housed in the sealed conveyance container has a wafer size for manufacturing a device in a minimized unit.

6. The yellow room system according to claim 3,
wherein the unit process apparatuses are constituted as application apparatuses for a photosensitive material on a workpiece, the application apparatuses including: a sealed-type container main body configured to house the photosensitive material and is configured to shield the exposure light; a supplying member configured to supply the photosensitive material onto a workpiece; and a plug-in connector removably coupling the container main body and the supplying member together, and
the plug-in connector has a structure configured to shield the exposure light, the plug-in connector including a valve configured to open during coupling.

7. The yellow room system according to claim 2, further comprising
a structure configured to open the conveyance-container door by attracting the conveyance-container door to the front-chamber door using a magnetic force of a magnet of the front-chamber door.

8. The yellow room system according to claim 7,
wherein a clearance is disposed between an magnetized object of the conveyance-container door and a magnetic material of the conveyance-container main body and a clearance is disposed between the magnetic material of the conveyance-container door and the magnet of the front-chamber door, so as to open and close the conveyance-container door.

9. The yellow room system according to claim 8,
wherein the unit process apparatuses are sealed-type treatment apparatuses configured to perform a singular treatment process in a device manufacturing process, the unit process apparatuses being portable,
the conveyance container is a sealed-type conveyance container configured to house one wafer as a workpiece target, and
the wafer housed in the sealed conveyance container has a wafer size for manufacturing a device in a minimized unit.

10. The yellow room system according to claim 8,
wherein the unit process apparatuses are constituted as application apparatuses for a photosensitive material on a workpiece, the application apparatuses including: a sealed-type container main body configured to house the photosensitive material and is configured to shield the exposure light; a supplying member configured to supply the photosensitive material onto a workpiece; and a plug-in connector removably coupling the container main body and the supplying member together, and
the plug-in connector has a structure configured to shield the exposure light, the plug-in connector including a valve configured to open during coupling.

11. The yellow room system according to claim 7,
wherein the unit process apparatuses are sealed-type treatment apparatuses configured to perform a singular treatment process in a device manufacturing process, the unit process apparatuses being portable,
the conveyance container is a sealed-type conveyance container configured to house one wafer as a workpiece target, and
the wafer housed in the sealed conveyance container has a wafer size for manufacturing a device in a minimized unit.

12. The yellow room system according to claim 7,
wherein the unit process apparatuses are constituted as application apparatuses for a photosensitive material on a workpiece, the application apparatuses including: a sealed-type container main body configured to house the photosensitive material and is configured to shield the exposure light; a supplying member configured to supply the photosensitive material onto a workpiece; and a plug-in connector removably coupling the container main body and the supplying member together, and
the plug-in connector has a structure configured to shield the exposure light, the plug-in connector including a valve configured to open during coupling.

13. The yellow room system according to claim 2,
wherein the unit process apparatuses are sealed-type treatment apparatuses configured to perform a singular treatment process in a device manufacturing process, the unit process apparatuses being portable,
the conveyance container is a sealed-type conveyance container configured to house one wafer as a workpiece target, and
the wafer housed in the sealed conveyance container has a wafer size for manufacturing a device in a minimized unit.

14. The yellow room system according to claim 2,
wherein the unit process apparatuses are constituted as application apparatuses for a photosensitive material on a workpiece, the application apparatuses including: a sealed-type container main body configured to house the photosensitive material and is configured to shield the exposure light; a supplying member configured to supply the photosensitive material onto a workpiece; and a plug-in connector removably coupling the container main body and the supplying member together, and the plug-in connector has a structure configured to shield the exposure light, the plug-in connector including a valve configured to open during coupling.

15. The yellow room system according to claim 1, wherein the minimized unit is one, and
the wafer size is 0.5 inches in diameter.

16. The yellow room system according to claim 15, wherein the unit process apparatuses are constituted as application apparatuses for a photosensitive material on a workpiece, the application apparatuses including: a sealed-type container main body configured to house the photosensitive material and is configured to shield the exposure light; a supplying member configured to supply the photosensitive material onto a workpiece; and a plug-in connector removably coupling the container main body and the supplying member together, and the plug-in connector has a structure configured to shield the exposure light, the plug-in connector including a valve configured to open during coupling.

17. The yellow room system according to claim 1, wherein the unit process apparatuses are constituted as application apparatuses for a photosensitive material on a workpiece, the application apparatuses including: a sealed-type container main body configured to house the photosensitive material and is configured to shield the exposure light; a supplying member configured to supply the photosensitive material onto a workpiece; and a plug-in connector removably coupling the container main body and the supplying member together, and the plug-in connector has a structure configured to shield the exposure light, the plug-in connector including a valve configured to open during coupling.

18. The yellow room system according to claim 1, wherein the unit process apparatuses are constituted as application apparatuses for a photosensitive material on a workpiece, the application apparatuses including: a sealed-type container main body configured to house the photosensitive material and is configured to shield the exposure light; a supplying member configured to supply the photosensitive material onto a workpiece; and a plug-in connector removably coupling the container main body and the supplying member together, and the plug-in connector has a structure configured to shield the exposure light, the plug-in connector including a valve configured to open during coupling.

* * * * *